(12) United States Patent
Magnusson et al.

(10) Patent No.: US 7,689,086 B2
(45) Date of Patent: Mar. 30, 2010

(54) RESONANT LEAKY-MODE OPTICAL DEVICES AND ASSOCIATED METHODS

(75) Inventors: Robert Magnusson, Storrs, CT (US); Yiwu Ding, Storrs, CT (US)

(73) Assignee: University of Connecticut, Farmington, CT (US)

( * ) Notice: Subject to any disclaimer, the term of this patent is extended or adjusted under 35 U.S.C. 154(b) by 380 days.

(21) Appl. No.: 11/188,452

(22) Filed: Jul. 25, 2005

(65) Prior Publication Data

US 2006/0024013 A1 Feb. 2, 2006

Related U.S. Application Data

(60) Provisional application No. 60/592,550, filed on Jul. 30, 2004.

(51) Int. Cl.
*G02B 6/10* (2006.01)
(52) U.S. Cl. ....................... 385/129; 385/131
(58) Field of Classification Search .............. 385/8–10, 385/129–132, 149
See application file for complete search history.

(56) References Cited

U.S. PATENT DOCUMENTS

| | | | |
|---|---|---|---|
| 5,216,680 A | 6/1993 | Magnusson et al. | |
| 5,598,300 A | 1/1997 | Magnusson et al. | |
| 5,978,524 A * | 11/1999 | Bischel et al. | 385/4 |
| 6,154,480 A | 11/2000 | Magnusson et al. | |

OTHER PUBLICATIONS

S. T. Peng, et al., "Theory of Periodic Dielectric Waveguides," IEEE Trans. Microwave Theory and Tech. MTT-23, 123-133 (1975).

P. Vincent, et al., "Corrugated Dielectric Waveguides: A Numerical Study Of The Second-Order Stop Bands," Appl. Phys. 20, 345-351 (1979).

G. A. Golubenko, et al., "Total Reflection Of Light From A Corrugated Surface Of A Dielectric Waveguide," Sov. J. Quantum Electron. 15, 886-887 (1985).

T. K. Gaylord, et al., "Analysis and Applications Of Optical Diffraction By Gratings," Proc. IEEE 73, 894-937 (1985).

L. Mashev, et al., "Zero Order Anomaly Of Dielectric Coated Gratings," Opt. Commun. 55, 377- 380 (1985).

(Continued)

*Primary Examiner*—Kevin S Wood
(74) *Attorney, Agent, or Firm*—McCarter & English, LLP

(57) ABSTRACT

Optical devices with versatile spectral attributes are provided that are implemented with one or more modulated and homogeneous layers to realize leaky-mode resonance operation and corresponding versatile spectral-band design. The first and/or higher multiple evanescent diffraction orders are applied to excite one or more leaky modes. The one- or two-dimensional periodic structure, fashioned by proper distribution of materials within each period, can have a resulting symmetric or asymmetric profile to permit a broadened variety of resonant leaky-mode devices to be realized. Thus, the attributes of the optical device permit, among other things, adjacent, distinct resonance frequencies or wavelengths to be produced, convenient shaping of the reflection and transmission spectra for such optical device to be accomplished, and the wavelength resonance locations to be precisely controlled so as to affect the extent to which the leaky modes interact with each other. Further, the profile asymmetry allows for the precise spectral spacing at interactive leaky modes so as to provide greater flexibility in optical device design.

35 Claims, 13 Drawing Sheets

OTHER PUBLICATIONS

R. F. Kazarinov, et al., "Second-Order Distributed Feedback Lasers With Mode Selection Provided By First-Order Radiation Loss," IEEE J. Quant. Elect. QE-21, 144-150 (1985).

S. Zhang, et al., "Spatial Modifications Of Gaussian Beams Diffracted By Reflection Gratings," J. Opt. Soc. Am. A 6, 1368-1381 (1989).

Avrutsky, et al., "Reflection Of A Beam Of Finite Size From A Corrugated Waveguide," J. Mod. Optics 36, 1527-1539 (1989).

M. T. Gale, et al., "Zero-Order Diffractive Microstructures For Security Applications," Proc. SPIE on Optical Security and Anticounterfeiting Systems 1210, 83-89 (1990). (abstract).

R. Magnusson, et al., "New Principle For Optical Filters," Appl. Phys. Lett. 61, 1022 (1992).

S. S. Wang, et al., "Theory And Applications Of Guided-Mode Resonance Filters," Appl. Opt. 32, 2606-2613 (1993).

S. S. Wang, et al., "Multilayer Waveguide-Grating Filters," Appl. Opt. 34, 2414-2420 (1995).

M. G. Moharam, et al., "Stable Implementation Of The Rigorous Coupled-Wave Analysis For Surface-Relief Gratings: Enhanced Transmittance Matrix Approach," J. Opt. Soc. Am. A 12, 1077-1086 (1995).

R. Magnusson, et al., "Transmission Bandpass Guided-Mode Resonance Filters," Appl. Opt. 34, 8106 (1995).

R. W. Day, et al., "Filter Response Lineshapes of Resonant Waveguide Gratings," J. Lightwave Tech. 14, 1815-1824 (1996).

S. Peng, et al., "Experimental Demonstration Of Resonant Anomalies In Diffraction From Two-Dimensional Gratings," Opt. Lett. 21, 549-551 (1996).

D. Rosenblatt, et al., "Resonant Grating Waveguide Structure," IEEE J. Quant. Electronics 33, 2038-2059 (1997).

S. Tibuleac, et al., "Reflection And Transmission Guided-Mode Resonance Filters," J. Opt. Soc. Am. A. 14, 1617 (1997).

F. Lemarchand, et al., "Increasing The Angular Tolerance Of Resonant Grating Filters With Doubly Periodic Structures," Opt. Lett. 23, 1149-1151 (1998).

Taflove, et al., Computational Electrodynamics: The Finite-Difference Time-Domain Method, $2^{nd}$ edition, Artech House, Norwood, MA, 2000.

D. L. Brundrett, et al., "Effects Of Modulation Strength In Guided-Mode Resonant Subwavelength Gratings At Normal Incidence," J. Opt. Soc. Am. A. 17, 1221-1230 (2000).

D. Wawro, et al., "Optical Fiber Endface Biosensor Based On Resonances In Dielectric Waveguide Gratings," Biomedical Diagnostic, Guidance, and Surgical-Assist Systems II, Proc. SPIE, 3911, 86-94 (2000).

Tibuleac, et al., "Narrow-Linewidth Bandpass Filters With Diffractive Thin-Film Layers," Opt. Lett. 26, 584 (2001).

Z. S. Liu, et al., "Concept Of Multiorder Multimode Resonant Optical Filters," IEEE Photonics Tech. Lett. 14, 1091-1093 (2002).

B. Cunningham, et al., "Colorimetric Resonant Reflection As A Direct Biochemical Assay Technique," Sens. Actuators B 81, 316-328 (2002).

B. Cunningham, et al., "A Plastic Colorimetric Resonant Optical Biosensor For Multiparallel Detection Of Label-Free Biochemical Interactions," Sens. Actuators B 85, 219-226 (2002).

M. Cooper, Nature Reviews. Optical Biosensors in Drug Discovery, 1, 515-528 (2002).

R. Magnusson, et al., "Diffractive Optical Components," Encyclopedia of Physical Science and Technology, Third Edition, vol. 4, pp. 421-440 Academic Press, 2002.

R. Magnusson, et al., "Photonic devices enabled by waveguide-mode resonance effects in periodically modulated films," Proc. SPIE, vol. 5225 Nano- and Micro-Optics for Information Systems, edited by Louay A. Eldada, (SPIE, Bellingham, WA, 2003) pp. 20-34.

Y. Ding and R. Magnusson, "Doubly-Resonant Single-Layer Bandpass Optical Filters," Opt. Lett. 29, 1135-1137 (2004).

Y. Ding, et al., "Polarization Independent Resonant Bandstop Filters Using 1D Periodic Layers With Asymmetric Profiles," Diffractive Optics and Micro-Optics Topical Meeting, DOMO 2004, Rochester, New York, Oct. 10-14, 2004.

Y. Ding, et al., "Use Of Nondegenerate Resonant Leaky Modes To Fashion Diverse Optical Spectra," Optics Express, vol. 12, pp. 1885-1891, May 3, 2004. [http://www.opticsexpress.org/abstract.cfm?URI=OPEX-12-9-1885].

Y. Ding, et al., "Resonant Leaky-Mode Spectral-Band Engineering And Device Applications," Opt. Express 12, 5661-5674 (2004).

C. F. R. Mateus, et al., "Broad-Band Mirror (1.12-1.62 µM) Using A Subwavelength Grating," IEEE Photonics Tech. Lett. 16, 1676-1678 (2004).

W. Suh, et al., "All-Pass Transmission Or Flattop Reflection Filters Using A Single Photonic Crystal Slab," Appl. Phys. Lett. 84, 4905-4907 (2004).

R. Magnusson, et al., "Spectral-Band Engineering With Interacting Resonant Leaky Modes In Thin Periodic Films," Proc. SPIE, vol. 5720, Conference on Micromachining Technology for Microoptics And Nanooptics, edited by E. G. Johnson, (SPIE, Bellingham, WA, 2005), pp. 119-129 (invited).

* cited by examiner

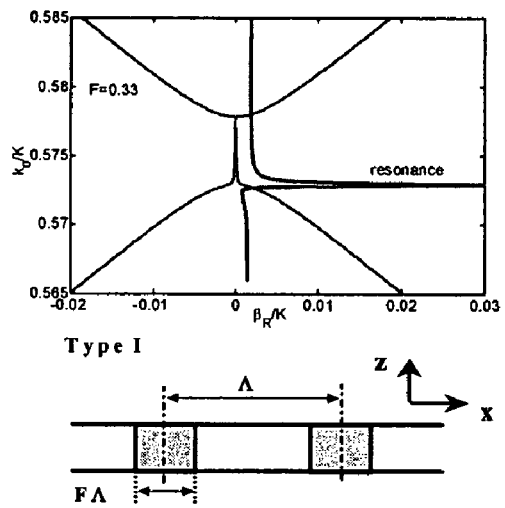
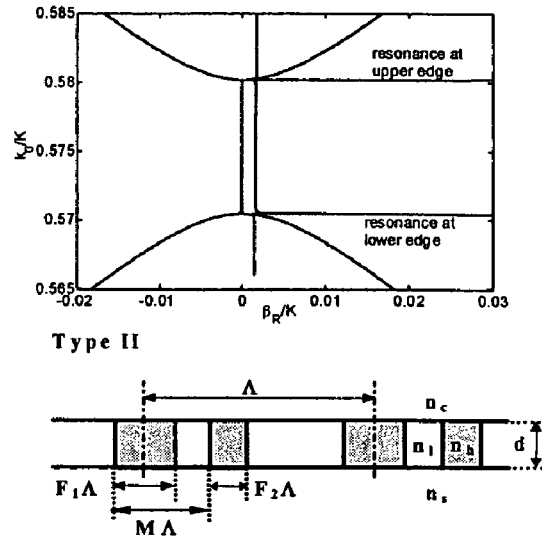
Fig. 8(a)    Fig. 8(b)
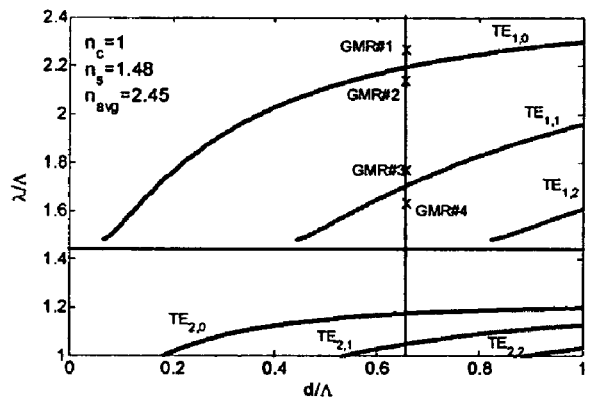
Fig. 9
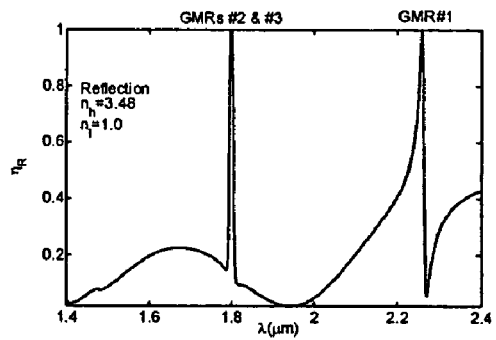
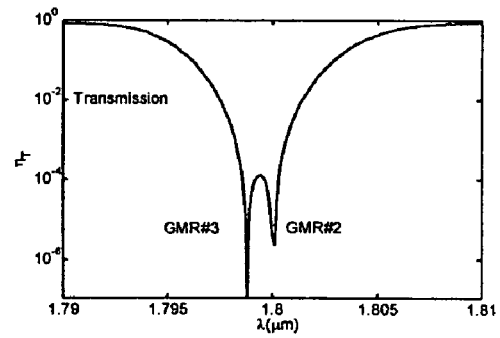
Fig. 10(a)    Fig. 10(b)

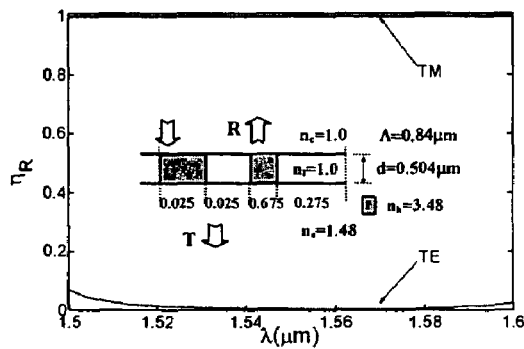
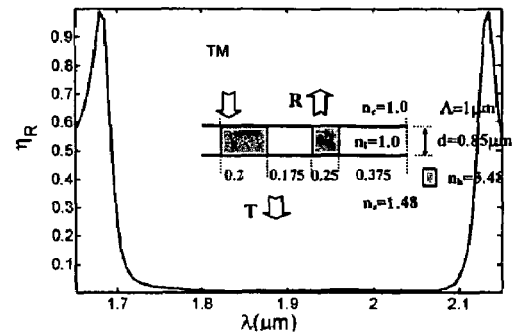
Fig. 16(a)      Fig. 16(b)
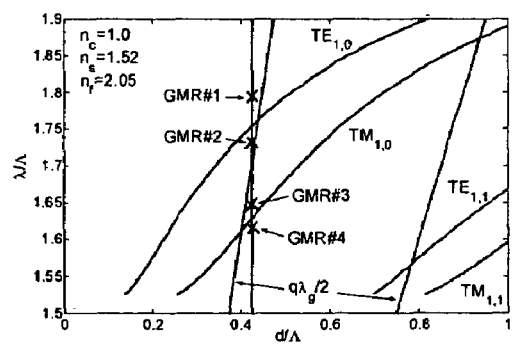
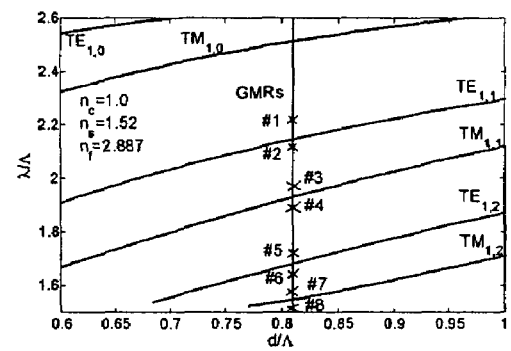
Fig. 18(a)      Fig. 18(b)

RESONANT LEAKY-MODE OPTICAL DEVICES AND ASSOCIATED METHODS

CROSS-REFERENCE TO RELATED APPLICATION

The present application claims the benefit of a co-pending provisional patent application entitled "Resonant Leaky Mode Optical Devices" which was filed on Jul. 30, 2004 and assigned Ser. No. 60/592,550. The entire contents of the foregoing provisional patent application are incorporated herein by reference.

BACKGROUND OF THE DISCLOSURE

1. Technical Field

The present disclosure relates to an advantageous new field of optical devices and, more particularly, to optical devices based on resonant leaky modes in periodically modulated films.

2. Discussion of Background Art

The field of thin-film optics is a mature area of optical technology. There are numerous companies and/or industries producing optical filters and devices of a great variety throughout the world. These devices typically consist of homogeneous layers deposited with precise thicknesses and materials parameters often under vacuum. Examples of currently marketed devices utilizing multilayered arrangements include, but are not limited to, laser mirrors, polarizers, anti-reflection film systems, bandpass filters, bandstop filters, edge filters, lowpass filters, high-pass filters, phase plates, tunable optical devices and/or filters, sensors, modulators, polarization control devices, hyper-spectral arrays, sensor arrays, beam splitters, etc.

A significant drawback associated with current optical devices is that a large number of layers, e.g., 10-200, are often needed to fashion the spectral and angular properties required for a particular application. These optical devices, which utilize homogeneous layer stacks, operate on the basis of multiple reflections between the interfaces incorporated in a layer stack. Thus, the amount and cost of material required to effectuate a desired optical effect can be significant. In addition, the adhesion difficulties associated with forming the multilayered stacks can cause problems. Further, there are interface scattering losses inherently associated with multi-layered arrangements.

The patent literature reflects previous developments involving optical devices. For example, U.S. Pat. No. 5,216,680 to Magnusson et al. describes a guided-mode resonance filter which can be used as an optical filter with narrow line width and as an efficient optical switch. Diffraction efficiencies and passband frequencies are calculated based on guided-mode resonance properties of periodic dielectric structures in a waveguide geometry. The guided-mode resonance filter preferably includes means for changing various parameters within the grating so as to change passband frequencies in response thereto. The disclosed diffraction grating could be supported by a semiconductor substrate adjacent to a semiconductor laser for fine-tuning the output of the semiconductor laser. The diffraction grating between thin-film layers of the Magnusson '680 patent can be designed so as to enhance the thin-film performance characteristics of the structure.

U.S. Pat. No. 5,598,300 to Magnusson et al. discloses ideal or near ideal filters for reflecting or transmitting electromagnetic waves having a wavelength range of approximately 100 nm to 10 cm. The disclosed filters combine a dielectric multilayer structure with a resonant waveguide grating and are valid for both TE and TM polarized waves. High efficiency, arbitrarily narrow band, polarized filters with low sidebands over extended wavelength ranges can be obtained according to the teachings of the Magnusson '300 patent. In addition, U.S. Pat. No. 6,154,480 to Magnusson et al. discloses vertical-cavity lasers (VCLs) fabricated without Bragg mirrors by replacing them with diffractive (guided-mode resonance or GMR) mirrors with much fewer layers, e.g., two or three layers. When incorporated in VCLs, the GMR mirrors yield single-mode, narrow-line, highly-polarized output light.

Notwithstanding that which is presently known with respect to optical devices and optical device-related technologies, a need remains for optical devices and optical device-related technologies that facilitate greater optical design and fabrication flexibility. In addition, a need remains for optical devices and optical device-related technologies that facilitate shaping of the reflection and transmission spectra of optical devices. These and other needs are met by the systems and methods disclosed herein. In addition, the disclosed systems and methods address numerous problems and shortcomings commonly associated with known optical devices and optical device-related technologies, thereby providing means for achieving greater optical design flexibility and effectiveness.

SUMMARY OF THE DISCLOSURE

The present disclosure, in at least one aspect, is directed to optical devices employing leaky modes in an innovative fashion by employing the first order or higher multiple evanescent diffraction orders in a single layer to excite one or more leaky modes. The periodic structure can have a symmetric or asymmetric profile to permit a broadened variety of resonant leaky-mode devices to be realized. Furthermore, the material within each period of this structure having a symmetric or asymmetric profile can be distributed in an arbitrary fashion to still further broaden the variety of obtainable devices. For example, a material with high refractive index value can be placed in two or more slots within each period. Essentially, this controls the amplitude of the various Fourier harmonics of the grating with concomitant control of the width of an associated leaky-mode resonance, and the separation of adjacent resonances, to be employed in the engineering of the spectral characteristics of a particular element. What is more, as nanoscale patterning and processing technologies continue to advance, steady progress in passive and active optical devices engineered with spatially modulated films can be expected, thereby further enhancing the utility and significance of the disclosed systems and methods.

Thus, one aspect of the present disclosure is directed to a new field of optical devices based on resonant leaky modes in periodically modulated films wherein the spatial modulation is such that an associated structure profile lacks reflection symmetry in a plane erected normal to the surface and normal to the grating vector and leaky resonant modes propagate in opposite directions when excited at, or near, normal incidence. One advantage provided by this arrangement is that adjacent, distinct resonance frequencies or wavelengths are produced. Also, convenient shaping of the reflection and transmission spectra for such optical devices may advantageously be accomplished. Another advantage is that the wavelength resonance locations may be precisely controlled so as to affect the extent to which the leaky modes interact with each other. Still another advantage is found in that the interaction spectral range can be large, providing the ability to produce wideband shaped spectra.

Another aspect of the present disclosure is directed to a method for realizing optical devices wherein multiple evanescent diffraction orders are provided in a single layer that may have a symmetric or asymmetric profile. In this aspect of the disclosure, these multiple first and higher evanescent diffraction orders may advantageously interact with the fundamental and higher waveguide modes to yield unique optical spectral characteristics. In each case, for these symmetric or asymmetric profiles, the material distribution within the period is arbitrary and can be chosen to suit the applicable device design constraints to realize a broad variety of spectral signatures and properties of the resulting elements. In fact, the deliberate design of the grating profiles to include a possibly complex, multi-component distribution of materials in order to fashion the final spectral response of guided-mode resonance (GMR) elements is significant for at least one aspect of the present disclosure.

In a further aspect of the present disclosure, a single modulated wave-guiding layer, i.e., a waveguide grating, with one-dimensional (1D) periodicity deposited on a substrate having arbitrary properties and having a top cover with arbitrary properties is provided with a refractive index that is higher than those of the surrounding media.

In another aspect of the present disclosure, an asymmetric device is modulated in two dimensions (2D). In this aspect, an exemplary 2D pattern can be a regular lattice of dots, or mesas, or holes with an appropriately offset sub-lattice to create the asymmetry. Alternatively, the 2D pattern can consist of arbitrarily shaped holes or mesas yielding the asymmetry.

In yet another aspect of the present disclosure, the 2D pattern can be symmetric or asymmetric and, as in the 1D case, the material distribution within each period may be arbitrary.

In still another aspect of the present disclosure, a system of two or more wave-guiding layers is employed to enhance the leaky-mode device performance.

In another aspect of the present disclosure, ease of fabrication and enhanced functionality may be achieved by employing a homogeneous waveguide layer and an adjacent, separate periodic layer to form the waveguide grating structure. Arbitrary combinations with one or more homogeneous layers and one or more periodic layers may be advantageously used.

The advantages and features associated with the aspects identified and discussed in the present disclosure are utilized in designing various optical devices including, for example, narrowband reflecting structures and filters (bandstop filters), wideband reflecting structures and filters (bandstop filters, mirrors), narrowband transmitting structures and filters (bandpass filters), and wideband transmitting structures and filters (bandpass filters). In addition, such advantages and features are effectively employed when using 1D periodicity to implement polarization independent devices such as narrowband and wideband bandstop and bandpass filters, or using 1D periodicity to implement polarization independent reflectors where the phase between the two orthogonal components is 180 degrees to implement a half-wave polarization plate or is 90 degrees to realize a quarter-wave plate. That is, as the amplitude for each polarization component has nearly unity reflectance and the phase is controllable by design, a variety of devices can be implemented for polarization control. The phase shifts imposed and/or achieved through such design factors can, in fact, be arbitrary, and not just 90 or 180 degrees, for more generalized control in this aspect of the present disclosure.

A particularly significant advantage of the optical device arrangement disclosed herein is that the optical spectral properties of a single modulated layer advantageously rival and exceed the performance provided by much more elaborate (i.e., multilayer) conventional thin-film devices.

Additional advantageous features and functions associated with the present disclosure will be readily apparent from the detailed description which follows, particularly when reviewed together with the figures appended hereto.

BRIEF DESCRIPTION OF THE FIGURES

So that those having skill in the art to which the subject matter of the present disclosure appertains will have a better understanding of uses and implementations of the present disclosure, including specifically optical spectral properties associated with a spatially modulated, periodic layer simultaneously possessing wave-guiding properties, reference is made to the accompanying figures wherein:

FIG. 7(b) shows a structure similar to a single-grating structure except that the waveguide layer has been converted to a periodic layer with the same average refractive index and where D is the diameter of the incident Gaussian beam.

FIGS. 8(a) and 8(b) are exemplary Brillouin diagrams showing second stopband detail for a single-layer waveguide grating.

FIG. 9 is a graphical representation of estimated resonance locations based on the eigenfunction of an equivalent homogeneous waveguide with the material parameters indicated on the figure.

FIGS. 10(a) and 10(b) are graphical representations of exemplary spectra of a narrowband reflection filter where $F_1=0.397$, $F_2=0.051$, $M=0.5$, $d=0.67$ μm, $\Lambda=1$ μm, $n_c=1$, $n_h=3.48$, $n_s=1.48$, $n_{avg}=2.445$, $\eta_R$ is the reflectance, and $\eta_T$ is the transmittance.

FIG. 14(a) illustrates spectrum at normal incidence and FIG. 14(b) illustrates angular spectrum at $\lambda=1.52$ μm with $F_1=0.444$, $F_2=0.13$, $M=0.74$, $d=0.728$ μm, $\Lambda=1.0$ μm, $n_c=1.0$, $n_s=1.0$, $n_h$3.48, $n_1=1.0$ and $\eta_T$ is the transmittance.

FIGS. 16(a) and 16(b) illustrate the spectrum of a polarizer and of an antireflection structure, respectively.

FIGS. 18(a) and 18(b) are graphical representations of estimated resonance locations for two parameter sets in accordance with an illustrative aspect of the present disclosure.

FIG. 19(a) is spectra with low modulation ($n_h=2.12$) and GMR#1 and GMR#2 having symmetric lineshapes as they are close to a $q\lambda_g/2$ line; and where FIG. 19(b) is spectra with high modulation ($n_h=2.282$), and where $F_1=0.4$, $F_2=0.26$, $M=0.6$, $d=0.134$ μm, $\Lambda=0.314$ μm, $n_c=1$, $n_s=1.52$, $n_{avg}=2.0665$, $\eta_R$ is the reflectance, and the low grating index used is $n_1=\sqrt{n_{avg}^2-Fn_h^2/(1-F)}$, where $F=F_1+F_2$.

FIG. 20(a) is as TE spectrum with $n_h=2.8$, FIG. 20(b) is a TM spectrum with $n_h=2.8$, and FIG. 20(c) is a reflectance with TE and TM incidence with $n_h=3.48$, 20(d) is a transmittance with TE and TM incidence with $n_h=3.48$, and where $F_1=0.435$, $F_2=0.225$, $M=0.5$, $d=0.68$ μm, $\Lambda=0.84$ μm, $n_c=1$, $n_s=1.52$, $n_{avg}=2.887$, and $\eta_T$ is the transmittance.

DETAILED DESCRIPTION OF EXEMPLARY EMBODIMENT(S)

A new field of optical devices based on resonant leaky modes in thin periodically modulated films is provided by the present disclosure. For illustrative purposes, reference is made to a number of illustrative implementations of the disclosed resonant leaky mode technology and associated applications. However, the present disclosure is not limited by the exemplary implementations disclosed herein, but rather is susceptible to many changes, enhancements, modifications and/or variations without departing from the spirit or scope of the present disclosure.

Figure 1:
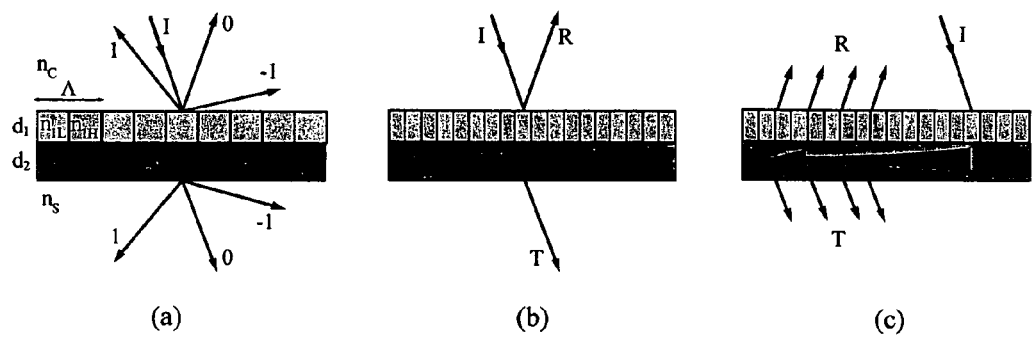
FIGS. 1(a) to 1(c) are schematic illustrations demonstrating diffraction by resonant photonic-crystal waveguide structures in accordance with an aspect of the present disclosure with 1(a) showing low-spatial-frequency waveguide grating wherein the period is greater than the wavelength, 1(b) showing high-spatial-frequency waveguide grating wherein the period is less than the wavelength, and 1(c) demonstrating how the excitation of a leaky mode with zero-order grating causes an efficient resonance.

With reference to FIGS. 1(a) to 1(c), the interaction of a diffraction grating (sometimes recently also called one-dimensional (1D) photonic crystal slab) and an incident plane wave is shown with key parameters, including layer thicknesses d, refractive indices n, period $\Lambda$, fill factor f, and the various propagating waves driven by the incident plane wave I with wavelength $\lambda$ and angle of incidence $\theta$ measured with respect to the surface normal. As shown, the period $\Lambda$ may be reduced and higher-order propagating waves may become increasingly cut off until the zero-order regime is obtained as shown in FIG. 1(b). If the structure contains an appropriate waveguide, the first-order waves that are evanescent or cut off can induce a resonance by being coupled to a leaky mode. Thus, thin-film structures containing waveguide layers and periodic elements (photonic crystals), under the correct conditions, can exhibit a guided-mode resonance (GMR) effect. When an incident wave is phase-matched, by the periodic element, to a leaky waveguide mode as shown in FIG. 1(c), it is reradiated in the specular-reflection direction with reflectance R as indicated in FIG. 1(c) as it propagates along the waveguide and constructively interferes with the directly reflected wave. Conversely and equivalently, the phase of the reradiated leaky mode in the forward, directly transmitted wave (transmittance T) direction shown in FIG. 1(c) is $\pi$ radians out of phase with the direct unguided T wave, thereby extinguishing the transmitted light [See, G. A. Golubenko, A. S. Svakhin, V. A. Sychugov, and A. V. Tishchenko, "*Total reflection of light from a corrugated surface of a dielectric waveguide*," Sov. J. Quantum Electron. 15, 886-887 (1985); D. Rosenblatt, A. Sharon, A. A. Friesem, "*Resonant grating waveguide structure*," IEEE J. Quant. Electronics 33, 2038-2059 (1997).]. The real part of the propagation constant may be expressed by the phase matching condition $$k_0 n_c \sin\theta - iK = \beta_i, \tag{1}$$

where i is the diffraction order index, $k_0 = 2\pi/\lambda$ is the free-space wave number, K is the magnitude of the grating vector, and $\theta$ is the angle of incidence. The effective leaky-mode (excited with the i=1 spectral order, for example) propagation constant can be expressed as $\beta_1 = \beta - j\alpha$ where j is the imaginary unit. The electric field associated with this mode varies as $$E_{LM} \sim \exp(j\beta x - \alpha x) \tag{2}$$

and thus the mode decays on travel along the resonant element as $\sim\exp(-\alpha x)$. For normal incidence and leaky-mode excitation by the i=±1 orders, $\beta = K$ yielding $$\Lambda = \lambda/N \tag{3}$$

where N is the effective mode index of refraction. Accordingly, at normal incidence a second-order Bragg condition prevails. The two counter-propagating leaky modes, driven by the input wave, set up a standing wave pattern in the waveguide layer at resonance; they are also coupled by the second-order Bragg condition.

For a given diffracted wave (usually i=1 and/or i=−1) exciting a leaky mode, the mode-propagation constant $\beta(\lambda_0)$ can be estimated by solving the eigenvalue equation of the waveguide-grating structure [S. S. Wang and R. Magnusson, "*Theory and applications of guided-mode resonance filters*," Appl. Opt. 32, 2606-2613 (1993); S. S. Wang and R. Magnusson, "*Multilayer waveguide-grating filters*," Appl. Opt. 34, 2414-2420 (1995)]. Thus, with $\beta$ known, the approximate resonance wavelength may be found from Equation (1). To find the exact resonance wavelength, the problem must be solved rigorously; the approximate wavelength provides a good starting value for the numerical computations. The resonance spectral linewidth may typically be narrow and can be controlled by the modulation amplitude, fill factor, layer thickness, and the refractive-index contrast of the device layers. The resonance response (location and linewidth) is polarization dependent due to inherent difference in modal characteristics of excited TE- and TM-waveguide modes. The spectral resonance location can be effectively set by the choice of the period.

Figure 2:
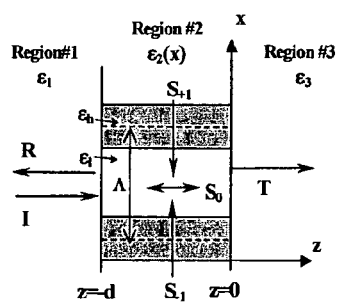
FIG. 2 is a schematic illustration of one type of a resonant periodic waveguide model in accordance with another aspect of the present disclosure.
Figure 3:
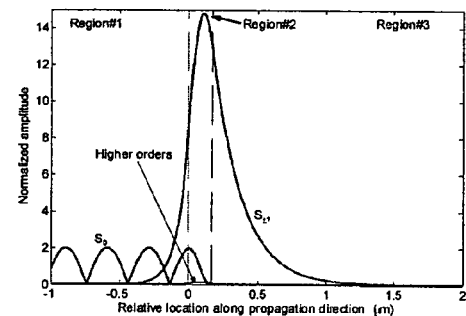
FIG. 3 is a graphical representation of field profile associated with leaky mode resonance in accordance with an illustrative aspect of the present disclosure.
Figure 4:
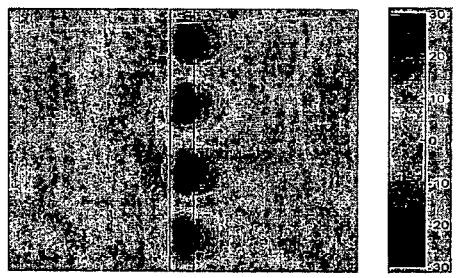
FIG. 4 is a snapshot of the standing-wave pattern associated with the leaky mode resonance of FIG. 3.

Referring to FIGS. 2 to 4, there is shown a single periodically modulated layer surrounded by regions of lower effective dielectric constant with a normally incident, TE-polarized wave in accordance with an aspect of the present disclosure. $S_i$ represents diffracted waves, $\in_i$ is the dielectric constant, and $\Lambda$ is the grating period. Numerical results may be obtained using rigorous-coupled wave analysis (RCWA) [T. K. Gaylord and M. G. Moharam, "*Analysis and applications of optical diffraction by gratings*," Proc. IEEE 73, 894-937 (1985)] and with the finite-difference time domain method (FDTD) [A. Taflove and S. C. Hagness, *Computational Electrodynamics: The Finite-Difference Time-Domain Method*, $2^{nd}$ edition, Artech House, Norwood, Mass., 2000] to provide quantitative information on relative field strengths and spatial extents associated with the near fields. The $S_0$ wave (zero order), as shown in FIG. 3, propagates along the z direction with reflected wave amplitude close to unity producing the standing-wave pattern shown by interference with the unit-amplitude input wave. Thus, at resonance, most of the energy is reflected back. The evanescent diffracted waves $S_1$ and $S_{-1}$ constitute the leaky mode. Because the grating layer may be used as both waveguide and phase matching element in the present case, the maximum field value is located in the grating layer with the evanescent tails gradually penetrating into the substrate and cover. The standing wave pattern formed by the counter-propagating $S_{-1}$ and $S_{+1}$ waves at a certain instant of time is shown in FIG. 4. Since the $S_{+1}$ space harmonics correspond to localized waves, they can be very strong at resonance. For the parameters selected in the present exemplary case, the maximum field amplitude may be enhanced by a factor of approximately 75 with modulation ($\Delta\in/\in_{av}$) of 0.011; and by approximately 750 with modulation of 0.0011. The maximum amplitude of $S_1$ is inversely proportional to modulation strength over the modulation range in the present case. In general, small modulation implies narrow linewidth and a large resonator Q factor $$Q = \lambda/\Delta\lambda \tag{4}$$

and thus, while the near field is enhanced with small modulation, the linewidth simultaneously becomes narrow. With a narrow linewidth, the resonance becomes very delicate, and in the present case, the loss in the material becomes an important factor in establishing the actual values of the fields at resonance. Further, efficient coupling into such a fine-line resonance requires well-collimated light beams. Consideration of these factors is significant in effectively applying the near-field enhancement associated with resonant periodic waveguides, for example, in nonlinear optics, optical switching, or particle manipulation.

Guided-mode resonant interaction may be manifested as rapid spectral or angular variations of the diffraction efficiencies (~intensities) of the propagating waves. When zero-order gratings are used, in particular, a high-efficiency resonance reflection can be obtained, which is the basis for high-efficiency filtering. Accordingly, with proper design, symmetric, low-sideband filters may be implemented. Applications such as GMR lasers, filters, modulators, as well as any of a variety of other similar optical devices, do not necessarily require symmetrical lines or low sidebands as such devices use only the top of the resonance peak and/or are more linear in the asymmetric regime.

Figure 5:
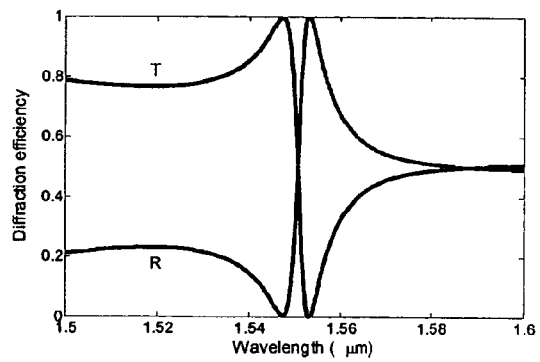
FIG. 5 is a graphical representation of a characteristic lineshape of a single-layer resonant structure in accordance with an illustrative aspect of the present disclosure.

Referring to FIG. 5, a calculated resonance lineshape for an arbitrary, zero-order periodic film is graphically depicted. As shown, the resonance is generally asymmetrical and exhibits a reflection peak near a minimum. Also, the transmittance has a corresponding minimum and a peak. A rapid variation in the phase is associated with the illustrated resonance effect. Accordingly, in an aspect of the present disclosure, various optical devices can be designed by optimizing the resonance peak; for example, with additions of antireflection layers to reduce the sidebands, bandstop, or reflection filters are obtained. For example, the transmission peak may be optimized to provide bandpass, or transmission, optical filters. Further, optical devices including, for example, optical filters having versatile spectral attributes may, in accordance with a preferred aspect of the present disclosure, be implemented with modulated films possessing asymmetric grating profiles. The profile asymmetry preferably breaks the leaky mode degeneracy at normal incidence to thereby permit precise spectral spacing of interacting leaky modes leading to greater flexibility in the design of optical devices.

Figure 6A:
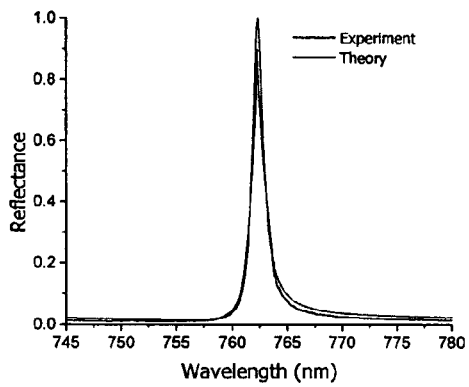
FIGS. 6(a) to 6(c) provide a graphical representation, a schematic of an exemplary dielectric resonance element, and a scanning electron micrograph (SEM), with FIG. 6(a) demonstrating a comparison between experimental data and theory where parameters for the theoretical curve fit are close to the nominal values (i.e., $n_c$=1.0, $n_1$=1.454 ($SiO_2$), $n_2$=1.975 ($HfO_2$), $n_s$=1.454, $d_1$=135 nm, f=0.58, $d_2$=208 nm, $\Lambda$=446 nm, and $\theta$=0°)
Figure 6B:
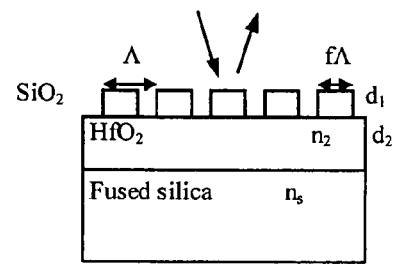
Figure 6C:
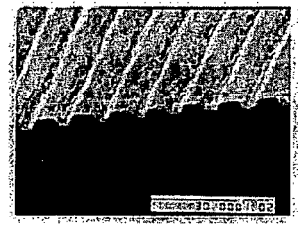

Referring to FIGS. 6(a) to 6(c), an exemplary dielectric guided-mode resonance device is shown which preferably acts as a bandstop filter with spectrum of interest being reflected in a narrow band with relatively low sidebands. As shown, although the theoretical calculation predicts 100 percent peak efficiency for a plane wave incidence, the efficiency is diminished in practice by various factors such as material shortcomings (e.g., scattering losses), incident beam divergence, and the lateral device size. By way of illustration, as shown in FIG. 6(b), an exemplary resonant device according to the present disclosure can be fabricated by depositing a waveguide grating (WGG) $HfO_2$ layer (e.g., approx. 210 nm and refractive index of n=2) and a $SiO_2$ layer (e.g., approx. 135 nm and n approx. 1.5) on a fused silica substrate (e.g., 1-inch diameter glass with refractive index n=1.5). Alternatively, an air/silicon WGG/insulator system may equally be used. In the present case, the $SiO_2$ grating may in turn be obtained by a series of processes including, for example, holographic recording of a photoresist mask grating (period of $\Lambda$=446 nm) with an Ar+UV laser ($\lambda$=364 nm) in a Lloyd mirror interference setup, development, deposition of an approx. 10 nm Cr mask layer on top of the photoresist grating, lift-off of the photoresist grating, and subsequent reactive-ion etching of the $SiO_2$ layer with $CF_4$. The surface roughness evident in the SEM of FIG. 6(c) contributes to the reduction in peak efficiency.

Figure 7A:
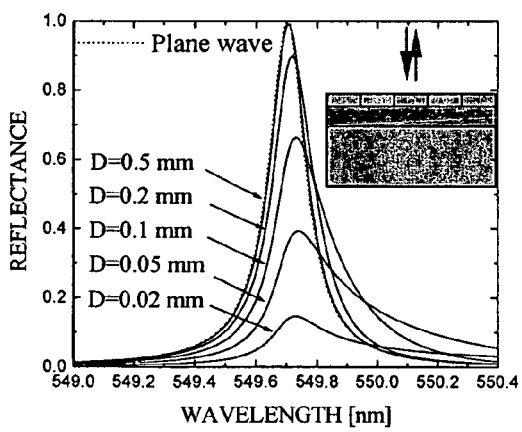
FIGS. 7(a) and 7(b) are graphical representations illustrating the effect of integrating a first-order Bragg grating into the resonance structure where
Figure 7B:
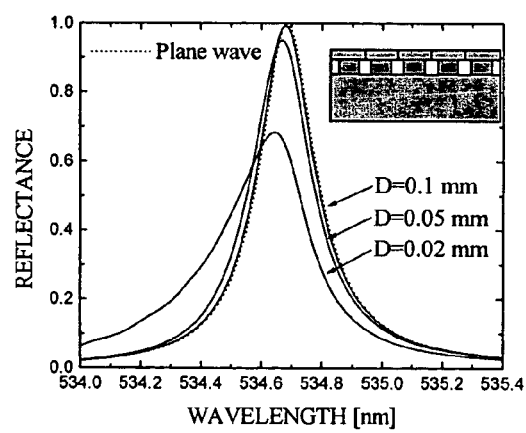
Figure 7:
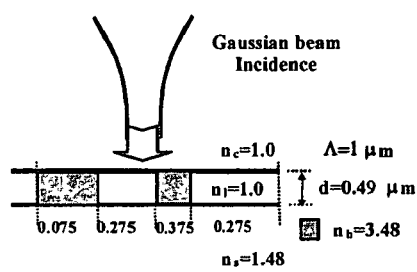
FIGS. 7(c) and 7(d) demonstrate diffraction properties of a broadband TE-polarized high reflector with Gaussian-beam incidence as an illustration of the ability of the devices of the present disclosure to efficiently resonate and reflect narrow incident laser beams.
Figure 7D:
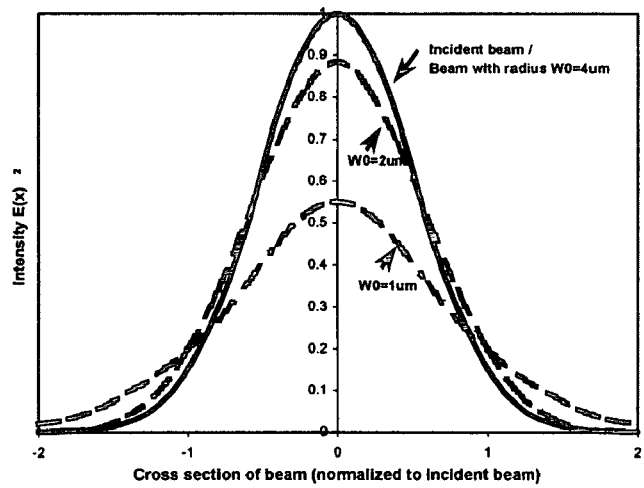

Furthermore, although the presently disclosed resonance filters exhibit high reflectance under a plane wave incidence, reflectance reduction and spatial modification of the beam profile occur under a practical finite beam illumination [See, S. Zhang and T. Tamir, "Spatial modifications of Gaussian beams diffracted by reflection gratings," J. Opt. Soc. Am. A 6, 1368-1381 (1989), I. A. Avrutsky and V. A. Sychugov, "Reflection of a beam of finite size from a corrugated waveguide," J. Mod. Optics 36, 1527-1539 (1989)]. This result stems from the typically narrow angular linewidth of the resonance filter. Accordingly, representing a Gaussian beam with an angular spectrum of plane waves, only the fraction of these plane wave components that fall within the filter's angular aperture will resonate. In an aspect of the present disclosure, a wider angular linewidth can preferably be achieved by incorporation of a first-order Bragg grating [See, F. Lemarchand, A. Sentenac, and H. Giovannini, "Increasing the angular tolerance of resonant grating filters with doubly periodic structures," Opt. Lett. 23, 1149-1151 (1998)]. In the present case, a grating period ($\Lambda_2$) may be chosen as $\Lambda_2=\Lambda/2$ to satisfy the first-order Bragg condition for the leaky modes. It is noted that consistent with Equation 3, the first-order grating cannot phase-match to the incident wave; it only provides waveguiding and coupling between the leaky modes. Exemplary results such as shown in FIGS. 7(a) and 7(b) demonstrate the improvement in resonance efficiency. For instance, as shown, a 100-µm beam resonates fully in the double grating device. Moreover, in accordance with exemplary aspects of the present disclosure, FIGS. 7(c) and 7(d) show that when employing a resonant element with broad reflection band and wide angular aperture, even a narrow Gaussian beam is efficiently reflected. It can be seen in this example that even when the waist of the Gaussian beam is only 8 µm in diameter (i.e., beam radius $w_0$=4 µm), high reflection efficiency (>98%) may be achieved.

Referring to FIGS. 8 to 12, illustrative spectral filters and like resonant photonic devices enabled by resonant elements with asymmetric grating profiles will now be discussed. As shown in FIGS. 8(a) and 8(b), exemplary single-layer modulated films may be designed, by placement of grating materials within each period, to have profile asymmetry. In this case, the asymmetry preferably works to remove the leaky-mode degeneracy at normal incidence. FIG. 8(a) is intended to demonstrate that GMR will only appear at one edge of the second stopband [See, D. L. Brundrett, E. N. Glytsis, T. K. Gaylord, and J. M. Bendickson, "Effects of modulation strength in guided-mode resonant subwavelength gratings at normal incidence," J. Opt. Soc. Am. A. 17, 1221-1230 (2000)] for a symmetric grating while resonance peaks will appear at each edge of the band for a grating without reflection symmetry as demonstrated by FIG. 8(b). As shown, the value of the average refractive index is comparably the same for both structures. Hence, the low grating index used in the computation can be found as $$n_1 = \sqrt{n_{avg}^2 - Fn_h^2}/(1-F) \qquad (5)$$

where $F=F_1+F_2$ for the type II profile. The dispersion curves can be calculated with the method introduced by Peng et al. [See, S. T. Peng, T. Tamir, and H. L. Bertoni, "Theory of periodic dielectric waveguides," IEEE Trans. Microwave Theory and Tech. MTT-23, 123-133 (1975)] and the spectra and field profiles can be calculated with software/computer codes based on rigorous coupled-wave analysis of wave propagation in periodic media [See, T. K. Gaylord and M. G. Moharam, "Analysis and applications of optical diffraction by gratings," Proc. IEEE 73, 894-937 (1985); M. G. Moharam, D. A. Pommet, E. B. Grann, and T. K. Gaylord, "Stable implementation of the rigorous coupled-wave analysis for surface-relief gratings: Enhanced transmittance matrix approach," J. Opt. Soc. Am. A 12, 1077-1086 (1995)].

With further reference to FIGS. 8(a) and 8(b), the exemplary profiles being denoted by type I (i.e., grating with symmetric profile) and type II (i.e., grating with generally asymmetric profile), as shown, each have a cover index $n_c$=1, a substrate index $n_s$=1.48, an average grating index $n_{avg}$=2, a high grating index $n_h$=2.05, a period $\Lambda$=0.3 µm, and a thickness d=0.14 µm. It is assumed in the present case calculations that the gratings are transversely infinite and that the materials are lossless. Further, the incident wave, in the present case, is taken as being TE polarized (electric vector normal to the page) and at normal incidence. In the figures, $k_0=2\pi/\lambda$ where $\lambda$ is the wavelength in free space, $K=2\pi/\Lambda$, and $\beta_R$ is the real part of the propagation constant of the leaky mode. Note that these dispersion curves are associated with the $TE_0$ mode and are transferred to the first Brillouin zone. The dashed curves are intended to demonstrate the resonance spectrum at normal incidence (not to scale).

Turning to FIG. 9, multiple GMRs resulting from interaction between several modes and multiple evanescent diffracted orders can be utilized to condition the spectral response. For example, this method has been used to design three-layer wideband bandstop filters [See, Z. S. Liu and R.

Magnusson, "*Concept of multiorder multimode resonant optical filters,*" IEEE Photonics Tech. Lett. 14, 1091-1093 (2002)] and single-layer bandpass filters [See, Y. Ding and R. Magnusson, "*Doubly-resonant single-layer bandpass optical filters,*" Opt. Lett. 29, 1135-1137 (2004)] using symmetric grating profiles. One difficulty in using this approach stems from the fact that the resulting resonance locations may be relatively widely separated as, for example, illustrated in FIG. 9. The graph of FIG. 9 may be constructed using a homogeneous planar waveguide eigenvalue equation and a phase-matching condition needed for coupling [See, S. S. Wang and R. Magnusson, "*Theory and applications of guided-mode resonance filters,*" Appl. Opt. 32, 2606-2613 (1993)]. The order-mode resonance connection is indicated in FIG. 9 by $TE_{m,v}$, where m represents the evanescent diffraction order exciting the v-th mode; for example, the resonance formed by the interaction between $TE_2$ and the $1^{st}$ evanescent diffracted order is written as $TE_{1,2}$. The resonances falling below the horizontal line $\lambda/\Lambda=1.48$ will have diffracted orders other than the $0^{th}$ orders radiating. It is noted that higher orders draw power and decrease the diffraction efficiency of the zero orders and thus may not be desirable.

For an asymmetric structure, as described above, there will be two resonances associated with each mode, one on each side of the curves in FIG. 9. For example, for a structure with $d/\Lambda=0.65$ in FIG. 9, there will be four such GMRs of interest, nondegenerate GMR#1 and GMR#2 associated with leaky mode $TE_0$ and GMR#3 and GMR#4 associated with leaky mode $TE_1$. The separation (in wavelength or frequency) of the two GMRs associated with a particular nondegenerate leaky mode is related to the width of the bandgap demonstrated in FIGS. 8(a) and 8(b). Thus, the spectral separation of GMR#1 and GMR#2 indicates the width of the $TE_0$ stopband and that of GMR#3 and GMR#4 shows the width for the $TE_1$ band. The width of the stopband can be increased by increasing the modulation strength $\Delta\in=n_h^2-n_1^2$ [See, S. S. Wang and R. Magnusson, "*Theory and applications of guided-mode resonance filters,*" Appl. Opt. 32, 2606-2613 (1993)] and by profile design. As shown in FIG. 9, possible interaction between GMR#2 and GMR#3 may be seen as $\Delta\in$ increases. Since each GMR is associated with 100% reflection, placing two GMRs near each other opens the possibility of a flat reflection band.

Thus, in accordance with a preferred aspect of the present disclosure, besides modulation, the separation of two GMRs can be controllable through the modulation profile by inducing asymmetry and hence modal non-degeneracy. Another preferred aspect of the present disclosure relates to the use of arbitrary materials distribution within each period to produce symmetric or asymmetric grating profiles to properly match the exciting evanescent orders and the resonant leaky modes. Therefore, with certain modulation strength available (i.e., given materials), it is preferably possible to design both wideband and narrow-band filter devices with geometric manipulations such as demonstrated by the following examples. As noted above, the present disclosure is not limited by the following examples, which are merely illustrative of the systems and/or methods of the present disclosure.

EXAMPLE 1

Referring to FIGS. 10(a) and 10(b), an exemplary bandstop filter with a narrow flattop and a type II profile as shown in FIG. 8(b) is demonstrated. As shown, the spectra pertinent to a bandstop filter with narrow flattop has near 1.8 μm wavelength and an approximate −35 dB transmission dip with bandwidth about 2 nm. The associated flat reflection top is formed by interacting GMR#2 and GMR#3, whose locations are seen in FIG. 10(b). Accordingly, the present exemplary filter can be enabled by interaction of the differentiated $TE_0$ and $TE_1$ modes as discussed/shown with reference to FIGS. 8(a) and 8(b).

Figure 11A:
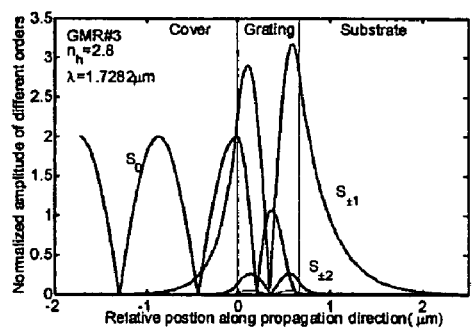
FIGS. 11(a) to 11(d) are graphical representations of exemplary field profiles of the excitation wave $S_0$ and leaky modes $S_{\pm 1}$ and $S_{\pm 2}$ pertaining to the exemplary resonant filter in FIGS. 10(a) and 10(b).
Figure 11B:
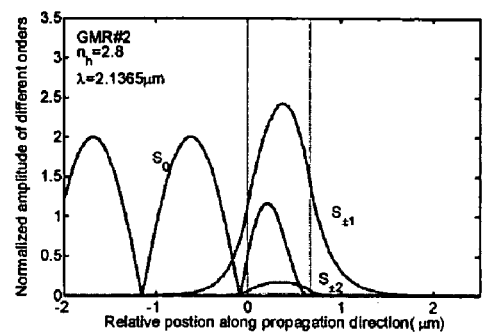
Figure 11C:
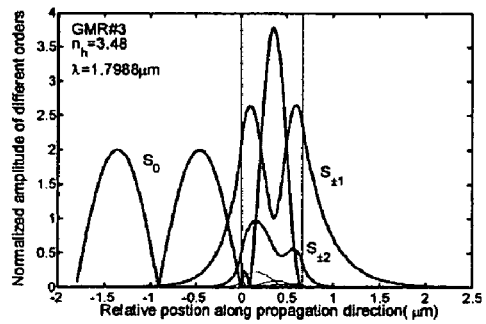
Figure 11D:
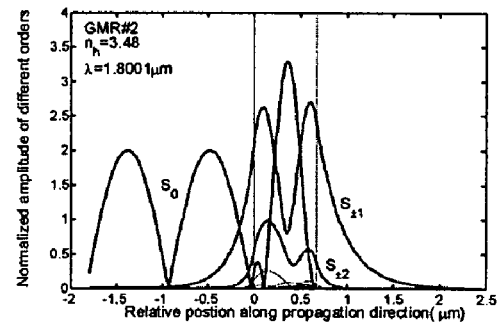

Further, the field profiles associated with this bandstop filter with narrow flattop and type II profile are demonstrated via FIGS. 11(a) to 11(d). FIGS. 11(a) and 11(b) show leaky-mode field profiles associated with GMR#3 and GMR#2, respectively, for a structure with $n_h=2.8$ while $n_{avg}$ is kept unchanged at 2.445. GMR#3 can be associated with a $TE_1$-like mode while GMR#2 is associated with a $TE_0$ mode as evidenced by FIGS. 11(a) and 11(b). As the modulation increases, there is some mixing of the modes on account of the resonance interaction, which is shown in FIGS. 11(c) and 11(d). It is noted in these computed results that as the modulation grows, higher evanescent diffraction orders ($S_{\pm2}$ and $S_{\pm3}$ shown) can contribute to the mode picture in accordance with the present disclosure.

EXAMPLE 2

Figure 12A:
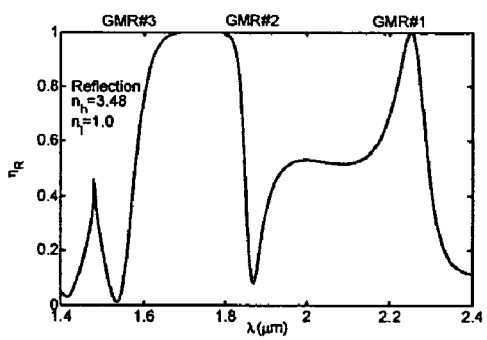
FIGS. 12(a) to 12(c) are graphical representations of exemplary spectra of a wideband reflection structure where $F_1=0.35$, $F_2=0.1$, $M=0.52$, $d=0.45$ μm, $\Lambda=1$ μm, $n_c=1$, $n_h=3.48$, $n_s=1.48$, and $n_{avg}=2.45$.
Figure 12B:
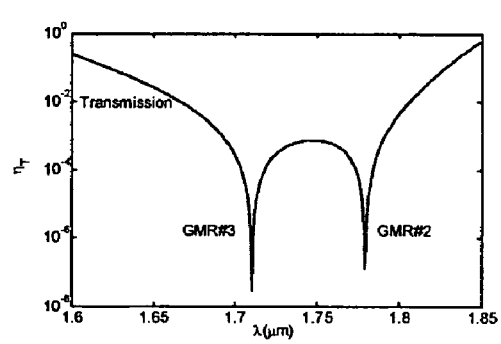
Figure 12C:
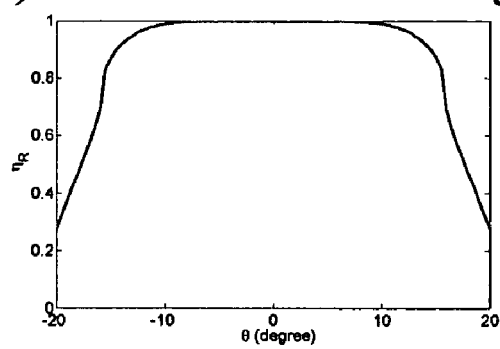

Referring to FIGS. 12(a) to 12(c), an exemplary bandstop filter with a wide flattop and a type II profile as shown in FIG. 8(b) is demonstrated. In this example, a bandstop structure with a wide flattop simulating a dielectric stack mirror is obtained. FIG. 12(a) shows the reflectance spectrum and FIG. 12(b) provides an enlarged view of the corresponding transmission spectrum. The corresponding wide angular spectrum associated with the present structure is shown in FIG. 12(c). As with the previous example, the flat reflection band is formed by GMR#2 and GMR#3 yielding a linewidth of approximately 150 nm with central wavelength near $\lambda=1.75$ μm.

EXAMPLE 3

Figure 13A:
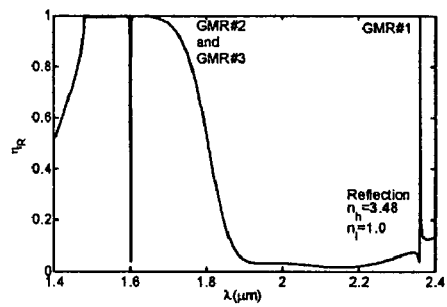
FIGS. 13(a) and 13(b) are graphical representations of exemplary spectra of a transmission structure. The parameters are: $F_1=0.5$, $F_2=0.05$, $M=0.55$, $d=0.39$ μm, $\Lambda=1$ μm, $n_c=1$, $n_h=3.48$, $n_s=1.48$, and $n_{avg}=2.667$.
Figure 13B:
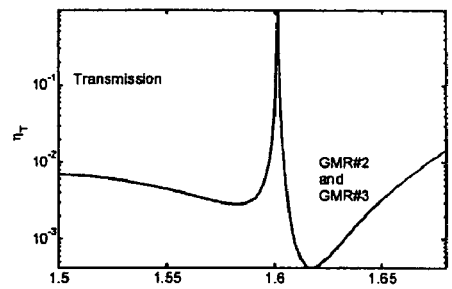

Referring to FIG. 13(a) and 13(b), an exemplary bandpass filter with a type II profile as shown in FIG. 8(b) is demonstrated. As shown, there is a narrow transmission peak at approximately 1.6 μm and a wide transmission band between 1.9 and approximately 2.3 μm as indicated by the corresponding low reflectance region in FIG. 13(a). The background of the narrow transmission peak at approximately 1.6 μm is provided by GMR#2 and GMR#3, while the peak is due to the asymmetrical lineshape associated with GMR#2. The wide transmission band between 1.9 approximately 2.3 μm is formed by the interaction between GMR#1 and GMR#2 shown in FIG. 9.

EXAMPLE 4

Figure 14A:
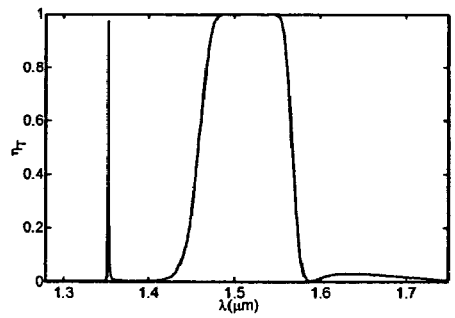
FIGS. 14(a) and 14(b) are graphical representations of spectra for a single-layer transmission structure where
Figure 14B:
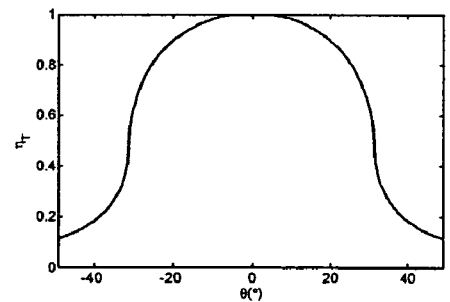

Referring to FIGS. 14(a) and 14(b), the spectra and corresponding angular spectrum for a single-layer transmission structure (i.e., a bandpass resonant element) are respectively shown. As shown, a wide flattop passband is realized near 1.5 μm and a narrow sideband at approximately 1.35 μm.

EXAMPLE 5

Figure 15A:
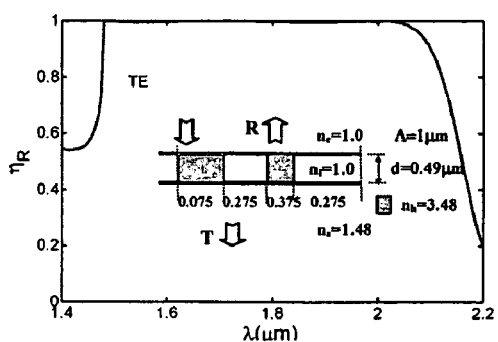
FIGS. 15(a) and 15(b) illustrate the spectral reflectance characteristics associated with exemplary resonance structures with FIG. 15(a) demonstrating TE polarization and FIG. 15(b) demonstrating TM polarization.
Figure 15B:
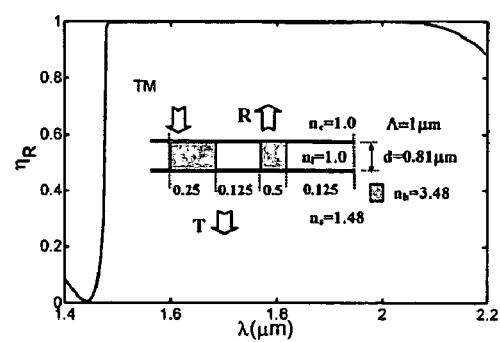

Referring to FIGS. 15(a) and 15(b), the spectral characteristics associated with a single-layer, wideband high reflector is illustratively shown with the TE polarization demonstrated in FIG. 15(a) and the TM polarization demonstrated in FIG. 15(b). These devices have the type II profile of FIG. 8(b) but apply symmetric materials distribution within the period as shown in the figure insets. These elements function as bandstop filters or reflectors with wide and flat spectra.

EXAMPLE 6

Referring to FIGS. 16(a) and 16(b), there is demonstrated a polarizer with a high extinction ratio and wide band in accordance with an illustrative aspect of the present disclosure (See FIG. 16(a)), as well as a structure with a flat passband, that is low reflection, across an extended region also in accordance with an illustrative aspect of the present disclosure (See FIG. 16(b)). These devices have the type II profile of FIG. 8(b) but apply asymmetric materials distribution within the period as shown in the figure insets.

In the foregoing examples, a high index material (e.g., $n_h$=3.48) was used in order to produce large modulation strength. It is noted that lower refractive indices may also be used. It is also noted that control of the width of the second stopband (i.e., the nondegenerate resonance locations at each edge) may involve tradeoff between the value of the modulation amplitude and the profile geometry.

Figure 17A:
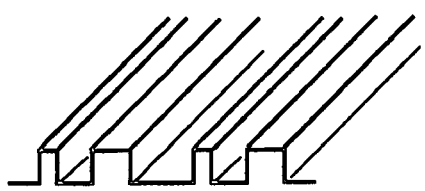
FIGS. 17(a) and 17(b) schematically illustrate 1D and 2D resonant periodic gratings, respectively, having examples of asymmetric profiles.
Figure 17B:
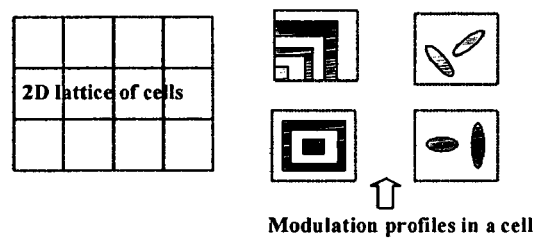

Thus, the above examples and discussion illustrate that guided-mode resonance elements possessing asymmetric (type II) grating profiles such as, for example, the structures shown in FIGS. 17(a) and 17(b), as well as GMR elements with symmetric (type I or type II) profiles are candidates for bandstop and bandpass filters with diverse spectral features. The separation of the nondegenerate resonances arising at the edges of the second stopband (for asymmetric type II structures) can be manipulated by controlling the bandgap via the grating modulation amplitude and profile fill factors. For symmetric structures, the connection of the exciting evanescent orders and the pertinent leaky modes can be accomplished by proper profile design of type II. Thus, the spectral spacing and level of interaction between adjacent resonant modes, in accordance with the present disclosure, are conveniently controllable. This, in turn, provides for new dimensions in the design of resonant photonic devices.

The exemplary filters discussed above include wideband and narrowband flattop bandstop and bandpass filters and although the discussion has emphasized single-layer structures, it is expected that additional layers may be incorporated so as to preferably enhance filter features. Moreover, the systems and methods disclosed herein are generally applicable to 2D layered photonic crystal lattices by, for instance, including a sublattice that is properly offset from the main lattice. As will be readily apparent to those of ordinary skill in the pertinent art based on the present disclosure, the number of combinations and possibilities is infinite.

With reference now to FIGS. 18 to 20, in accordance with an aspect of the present disclosure, profile asymmetry may be used to shape the spectral bands provided by single-layer modulated films and to obtain regions of polarization independence. The asymmetry preferably removes the leaky-mode degeneracy at normal incidence, which has been used to design filters with spectral properties of interest in many applications [Y. Ding and R. Magnusson, "*Use of nondegenerate resonant leaky modes to fashion diverse optical spectra*," Optics Express, vol. 12, pp. 1885-1891, May 3, 2004]. The contents of the foregoing Ding et al. publication are incorporated herein by reference.

As shown in FIGS. 18(a) and 18(b), estimated resonance locations for two parameter sets based on the eigenvalue function of the equivalent single-layer homogeneous waveguide are illustratively shown [See, S. S. Wang and R. Magnusson, "*Theory and applications of guided-mode resonance filters*," Appl. Opt. 32, 2606-2613 (1993)]. The order-mode resonance connection is indicated by $TE_{m,v}$ or $TM_{m,v}$, where m represents the evanescent diffraction order exciting the v-th TE or TM mode. Structures close to $q\lambda_g/2$ (q is an integer, $\lambda_g$ the wavelength in the film) lines have thickness around a multiple of half-wavelength at resonance and symmetrical line shape will appear [See, R. W. Day, S. S. Wang and R. Magnusson, "*Filter response lineshapes of resonant waveguide gratings*," J. Lightwave Tech. 14, 1815-1824 (1996).].

As the resonances arise at the edges of the second stop band, the separation of the two GMRs depends upon the width of the stopband. Thus, as previously discussed and further exemplified in FIG. 18(a), the spectral separation of GMR#1 and GMR#2 indicates the width of the $TE_0$ stopband and that of GMR#3 and GMR#4 shows the width for the $TM_0$ stopband. As demonstrated in FIG. 18(a), it is possible to place GMR#2 and GMR#3 near the same wavelength, as the width of the second stopband for both $TE_0$ and $TM_0$ modes can be increased by the modulation strength $\Delta\in=n_h^2-n_1^2$. By appropriate profile design, GMR#2 and GMR#3 can have comparable linewidth and similar lineshape resulting in a polarization independent structure. It is noted that there is no interaction between GMR#2 and GMR#3 in FIG. 18(a) because one GMR is associated with a TE mode and the other is with a TM mode. If two GMRs associated with the same polarization (i.e., GMR#2 and GMR#5, or GMR#4 and GMR#7 in FIG. 18(b)) are placed close to each other, they will interact and lead to spectra with versatile properties as previously discussed. In addition, interaction between GMR#2 and GMR#5 forms a flat reflection band for TE incidence, and the interaction among GMR#3, GMR#4, GMR#7 and GMR#8 will form a flat reflection band for TM incidence and the overlapping portion of the two reflection bands is polarization independent.

Still further interaction possibilities arise on mixing/interacting of modes with dissimilar polarization states. This is accomplished with anisotropic materials or by other means that induce TE-TM mode conversions in the structure. Such materials may be used in forming the waveguide layer or any layer, or combination of layers, in the device structure. Such material selection and material combinations are yet another design feature for producing spectrally versatile optical devices of the present disclosure.

With respect to the foregoing, to simplify the analysis, the gratings are assumed transversely infinite and the materials are assumed lossless and dispersion free. Further, the incident wave is taken as being at normal incidence and the spectra calculated with computer codes based on rigorous coupled-wave analysis (RCWA) of wave propagation in periodic structures [See, T. K. Gaylord and M. G. Moharam, "*Analysis and applications of optical diffraction by gratings*," Proc. IEEE 73, 894-937 (1985), M. G. Moharam, D. A. Pommet, E. B. Grann, and T. K. Gaylord, "*Stable implementation of the rigorous coupled-wave analysis for surface-relief gratings: Enhanced transmittance matrix approach*," J. Opt. Soc. Am. A 12, 1077-1086 (1995)].

Figure 19A:
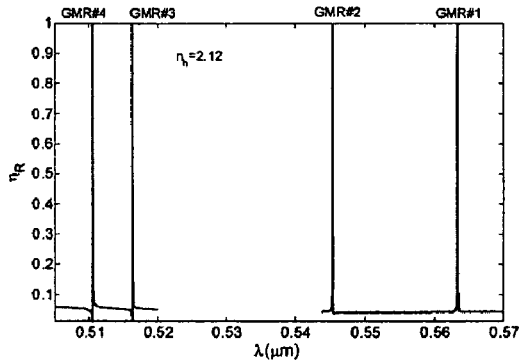
FIGS. 19(a) and 19(b) are graphical representations of spectra for an exemplary narrowband reflection filter where
Figure 19B:
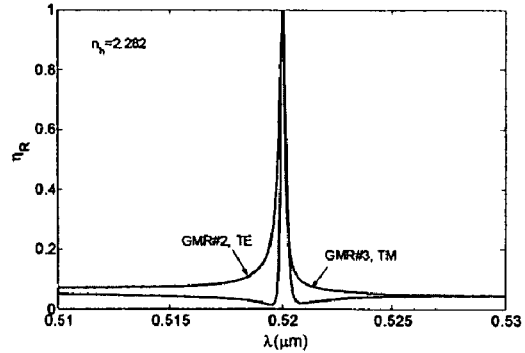
Figure 20A:
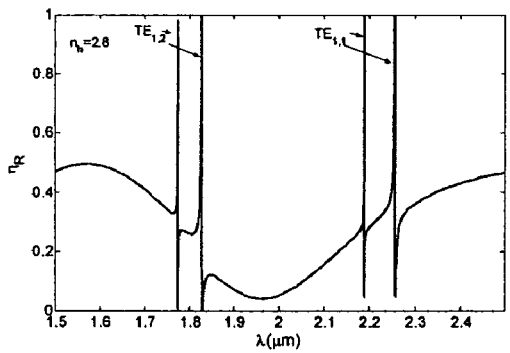
FIGS. 20(a) to 20(d) are graphical representations of spectra for an exemplary wideband reflection filter where
Figure 20B:
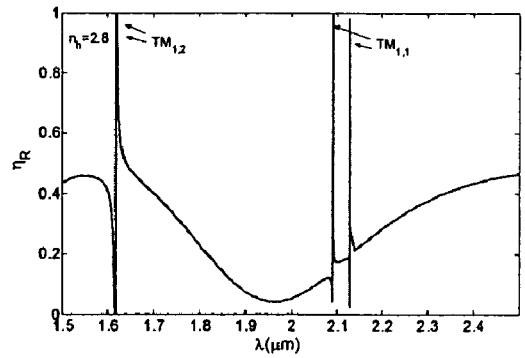
Figure 20C:
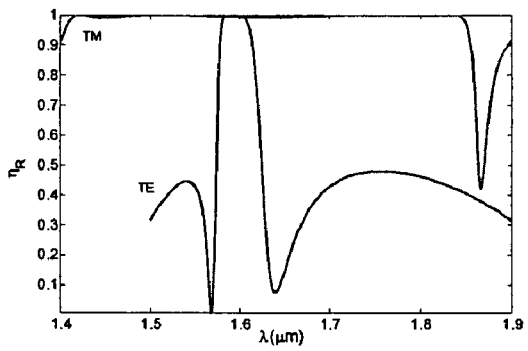
Figure 20D:
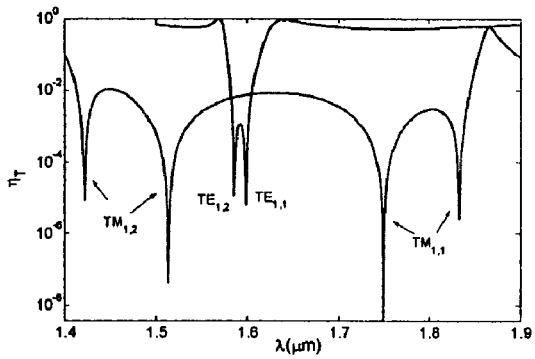

Referring to FIGS. 19(a) and 19(b), there is shown the spectra pertinent to a bandstop filter with narrow band. As demonstrated in FIG. 19(a), the GNRs associated with the same leaky modes are well separated even when modulation is small (i.e., $n_h$=2.12). As modulation increases, the like GMRs will be further pushed away from each other such that when $n_h$ increases to 2.282, GMR#2 and GMR#3 overlap and provide a polarization independent bandstop structure as shown in FIG. 19(b).

Furthermore, with reference to FIGS. 20(a) to 20(d), there are shown the spectra of a bandstop filter with wide band. The GMRs associated with different leaky modes are best shown in FIGS. 20(*a*) and 20(*b*) for a comparatively small modulation (i.e., $n_h$=2.8). As modulation increases, the GMRs approach each other and their linewidths increase. Consequently, the GMRs begin to interact with each other. When $n_h$ increases to 3.48, a polarization independent 20 dB reflection band centered at about 1.6 μm with approximately 20 nm bandwidth is formed. The GMRs contributing to the reflection band are marked in FIG. 20(*d*). It is noted that the TM reflection band is very wide (approx. 400 nm).

Thus, in accordance with an illustrative aspect of the present disclosure, guided-mode resonance elements possessing asymmetric grating profiles are candidates for polarization independent bandstop filters. The separation of the nondegenerate resonances arising at the edges of the second stopband can be manipulated by controlling the bandgap via the grating modulation amplitude and profile fill factors. The exemplary filters identified and discussed above may thus include polarization independent wideband and narrowband bandstop filters and, although the present discussion has been limited to single-layer structures, as will be readily apparent to those of ordinary skill in the pertinent art, it is expected that additional layers will enhance filter features. And by applying similar methods, polarization independent bandpass filters can also be realized.

By way of further elaboration, in an illustrative embodiment of the present disclosure, a bandpass filter based on guided-mode resonance effects in a single-layer periodic waveguide is implemented. A bandpass resonant filter utilizes the transmission peak associated with a reflection minimum in the naturally asymmetrical spectral curve. By using multilayer dielectric coatings to generate a wideband low-transmission background while maintaining the transmission peak, structures supporting transmission bandpass characteristics can be obtained [See, R. Magnusson and S. S. Wang, "*Transmission bandpass guided-mode resonancefilters*," Appl. Opt. 34, 8106 (1995); S. Tibuleac and R. Magnusson, "*Reflection and transmission guided-mode resonance filters*," J. Opt. Soc. Am. A. 14, 1617 (1997)]. Employing genetic algorithms, simpler transmission type structures with reasonable line shape can also be found [See, Tibuleac and R. Magnusson, "*Narrow-linewidth bandpass filters with diffractive thin-film layers*," Opt. Lett. 26, 584 (2001)].

Figure 21A:
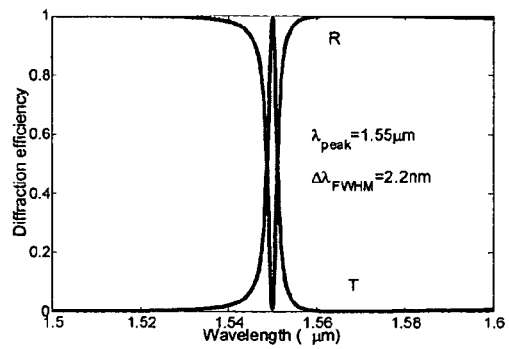
FIGS. 21(a) and 21(b) are a graphical representation of the spectral and angular response of an exemplary single-layer bandpass filter structure in accordance with an illustrative aspect of the present disclosure where the period is 1120nm, $n_s=1.3$, $n_H=3.48$, $n_L=2.427$, and $n_c=1.0$.
Figure 21B:
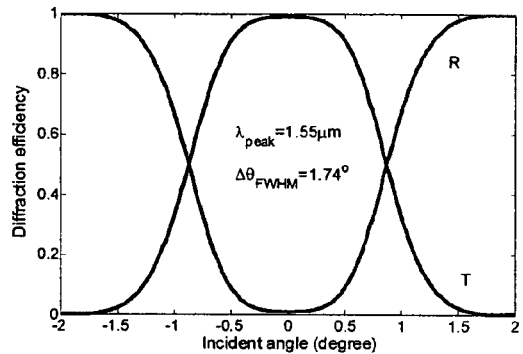
Figure 22:
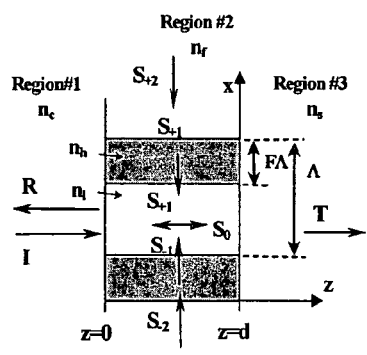
FIG. 22 is a schematic illustration of one type of a resonant periodic waveguide diffraction model in accordance with an illustrative aspect of the present disclosure.

Referring to FIGS. 21(*a*) and 21(*b*), illustrative spectral and angular resonance characteristics of a single-layer filter are shown. This type of structure utilizes high modulation to support excitation of a double resonance in a type I profile element as per FIG. 8(*a*). In comparison to reflection structures, single-layer transmission structures can be difficult to design at least because the resonance is fundamentally associated with zero transmission or a reflection peak, and because it can be difficult to establish a low transmission background with a single dielectric homogeneous layer. However, as provided by the present disclosure, such single-layer bandpass filters may be advantageously realized in resonant elements possessing, as noted above, strong modulation to support the excitation of two types of resonance. For example, the low transmission background of the bandpass filter can be formed by resonant excitation of leaky mode $TE_2$ by the ±1 evanescent diffracted orders, whereas the transmission peak arises by excitation of leaky mode $TE_0$ by the ±2 evanescent diffracted orders. Even though both of these resonances are fundamentally reflection type, the asymmetrical line shape of the resonance enables the appearance of a transmission peak as in the case of known multilayer bandpass filters. FIG. 22 shows an exemplary resonant periodic waveguide diffraction model where $S_i$ represents the complex amplitudes of the diffracted waves, $n_c$, $n_s$ are the refractive indices of regions 1 and 3, $n_f$ is the effective refractive index of the periodic waveguide with $n_f=\sqrt{Fn_h^2+(1-F)n_1^2}$, Λ is the grating period, F is the fill factor and d is thickness of the waveguide.

To obtain resonance, waveguide modes have to be generated with the incident wave satisfying the phase-matching condition of the periodic structure. This leads to $$N_v=\beta_v/k\approx|m|\lambda/\Lambda \qquad (5)$$

where $N_v$ is the effective index of mode v of the equivalent homogeneous waveguide, $\beta_v$ is the propagation constant of the mode, k is the propagation constant in free space, λ is wavelength in free space, and the integer m represents the $m^{th}$ diffracted order. This formula works well when the grating modulation is not very strong [See, S. S. Wang and R. Magnusson, Appl. Opt. 32, 2606 (1993)]. However, the formula may still be used as a starting point to locate the resonance in the case of strong modulation.

Figure 23:
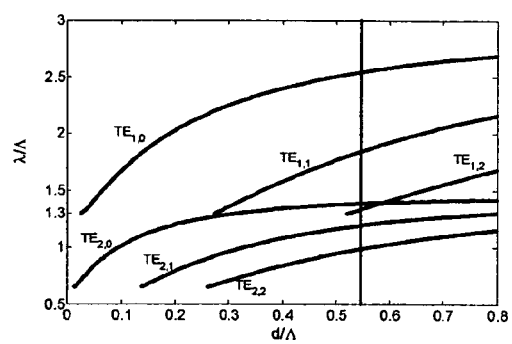
FIG. 23 is a graphical representation showing estimated resonance locations based on the eigenfunction of an equivalent homogenous waveguide where $n_c=1$, $n_s=1.3$, $n_f=2.94$.

Equation (5) shows that the $v^{th}$ mode can be resonant with the $m^{th}$ diffracted order. For example, mode $TE_1$ can be resonant with the $2^{nd}$ diffracted order, and $TE_2$ can be resonant with the $1^{st}$ diffracted order. If the order-mode resonance is expressed as $TE_{m,v}$, where m represents the diffraction order and v represents the mode, the above resonance pairs can be written as $TE_{2,1}$ and $TE_{1,2}$. As shown in FIG. 23, certain resonance pair such as $TE_{1,2}$ and $TE_{2,0}$ can be designed to be close in wavelength. Thus, with respect to the present illustrative embodiment, resonance pair $TE_{1,2}$ and $TE_{2,0}$ can be utilized to design a bandpass filter. FIG. 23 may be obtained with the help of the homogenous waveguide eigenfunction and Equation (5). For a single layer homogenous waveguide, its eigenfunction can be expressed in the form of $f$ ($N_v$,d/λ, v)=0. According to Equation (5), $N_v$ can be approximated with $|m|\lambda/\Lambda$ so that the eigenfunction is provided in the form of $f(|m|\lambda/\Lambda,d/\lambda,v)=0$. By selecting another set of variables, the eigenfunction can be transformed to the form $f(\lambda/\Lambda,d/\Lambda, |m|,v)=0$ and used to plot the graph of FIG. 23.

To support multi-resonance, the effective refractive index of the grating layer should be considerably higher than that of the cover and substrate. Specifically, since $n_f>N_v>\max(n_c, n_s)$, excitation of resonance with the $m^{th}$ diffracted order while maintaining the $0^{th}$ order as the only radiating order requires $$n_f>|m|\cdot\max(n_c, n_s) \qquad (6)$$

This constraint may limit the choice of suitable materials that may be utilized for particular applications of the present disclosure.

At the resonance wavelength, a reflection peak appears. The linewidth of this peak depends on the coupling strength between the diffracted order and the incident wave, which, in turn, relates to the grating modulation amplitude. Generally, larger coupling strength yields increased linewidth [See, R. Magnusson and S. S. Wang, "*New principle for optical filters,*" Appl. Phys. Lett. 61, 1022 (1992)]. Considering two adjacent resonances, as in FIG. 24, the one with stronger coupling will have a wide reflection peak and can furnish the low-transmission background needed for the bandpass filters of the present disclosure.

To a first-order approximation, the grating harmonics $|\in_q/ \in_0|$ indicate the coupling strength between the $q^{th}$ diffracted order and the incident wave near resonance. The relative permittivity (i.e., dielectric constant) modulation of the periodic waveguide can be expanded into Fourier series as $$\varepsilon(x) = \sum_{q=-\infty}^{+\infty} \varepsilon_q e^{jqKx} \quad (7)$$

where $\varepsilon_q$ is the q-th Fourier harmonic coefficient, $K=2\pi/\Lambda$, and $\varepsilon_0$ is the effective relative permittivity of the grating.

Figure 24:
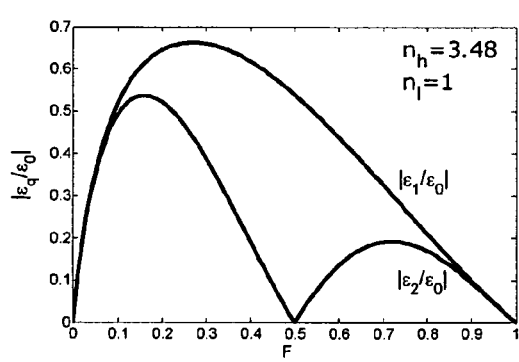
FIG. 24 is a graphical representation of Fourier grating harmonics $|\mathcal{E}_q/\mathcal{E}_0|$ as a function of a fill factor for a rectangular waveguide-grating profile.

As shown in FIG. 24, $|\varepsilon_q/\varepsilon_0|$ are functions of the fill factor F. Since $|\varepsilon_1/\varepsilon_0|$ is always higher than $|\varepsilon_2/\varepsilon_0|$ for a periodic waveguide with rectangular profile, $TE_{1,2}$ will have a wider reflection peak and can be used to provide the low transmission background. Moreover, to support a wide transmission background, $|\varepsilon_1/\varepsilon_0|$ should be considerably higher than $|\varepsilon_2/\varepsilon_0|$. At the same time, $|\varepsilon_1/\varepsilon_0|$ should have a moderate value such that the linewidth of $TE_{2,0}$ will still be appreciable. These considerations can be used to choose a fill factor.

It has been shown that the resonant structure has asymmetrical line shape in general and that the symmetrical line shape will appear only under certain conditions such as, for example, when the thickness of the structure is near a multiple of half-wavelength at resonance [See, R. W. Day, S. S. Wang and R. Magnusson, "*Filter response lineshapes of resonant waveguide gratings*," J. Lightwave Tech. 14, 1815 (1996)]. For the present exemplary case, this situation should be avoided such that an asymmetrical line shape can be maintained. In considering a numerical example, based on FIG. 23, if d/Λ is set to be 0.56, two close resonances $TE_{1,2}$ ($\lambda/\Lambda \cong 1.35$) and $TE_{2,0}$ ($\lambda/\Lambda \cong 1.39$) can be located. If the transmission peak is to be centered at 1.55 μm, the period of the structure (Λ) is determined to be approximately 1.12 μm with $\lambda/\Lambda \cong 39$, since $TE_{2,0}$ is supplying the transmission peak. Then the thickness (d) can be determined as approximately 0.62 μm.

Figure 25:
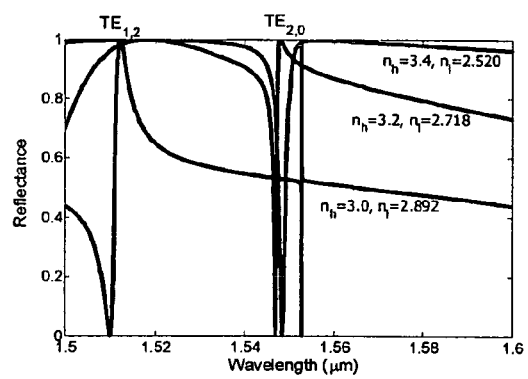
FIG. 25 is a graphical representation of reflectance spectra for a resonant waveguide-grating filter with different modulation strengths with $n_f=2.94$ maintained constant and $d=0.62$ μm,$\Lambda=1.12$ μm, $F=0.44$, $n_c=1$ and $n_s=1.3$.

FIG. 25 shows the spectra of the structure with three different modulations. When the modulation is not very strong, i.e., $n_h=3.0$ and $n_f=2.94$, the $TE_{1,2}$ and $TE_{2,0}$ resonances are isolated. With increasing modulation strength, the resonance peak of $TE_{1,2}$ expands and changes the background around $TE_{2,0}$. After numerically tuning the parameters such as thickness and period, a structure with a quality line shape may be obtained. The parameters of the final single-layer filter and the corresponding spectra are illustratively shown in FIGS. 21(a) and 21(b). In operation, the device of the present embodiment is based on double resonance where one resonance provides the low transmission band with the other furnishing the transmission peak through its asymmetrical line shape. The structure profile has a narrow linewidth because the transmission peak is associated with the second diffraction order that has a relatively weak coupling coefficient. Thus, even though the transmission sidebands are provided by a resonant leaky mode, their extent can be considerable.

Having discussed various features and physical mechanisms basic to a single-layer bandpass resonant periodic waveguide filter, it will be readily apparent to those of ordinary skill in the pertinent art that other configurations and/or arrangements suitable to provide that same or similar results equally may be employed and clearly fall within the scope of the present disclosure.

Figure 26:
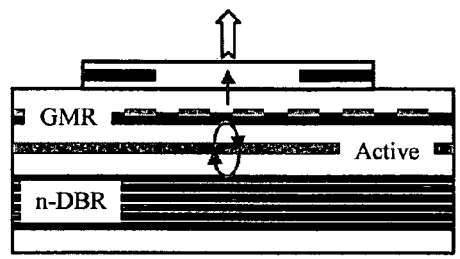
FIG. 26 is a resonant VCSEL in accordance with an illustrative embodiment of the present disclosure.

In another illustrative embodiment of the present disclosure, a vertical-cavity surface-emitting laser (VCSEL) is provided wherein distributed Bragg reflectors (DBR) are not relied on for its operation. That is, by replacing the upper mirror with resonating photonic-crystal waveguide elements (e.g., guided-mode resonance (GMR) mirrors) that effectively reflect light in a narrow spectral band, such as, for example, a filter. An exemplary VCSEL is shown in FIG. 26. The VCSEL, as shown, has a lower DBR mirror. Alternatively, a simple metallic or dielectric mirror or the like equally may be used. The particular type of lower mirror selected may depend on the material system and fabrication processes, nonetheless the mirror does not affect the fundamental operation of the proposed VCSELs. In fact, the broadband mirrors with type I or type II (symmetric or asymmetric) profiles could be beneficially incorporated in such resonant VCSELs.

Figure 27:
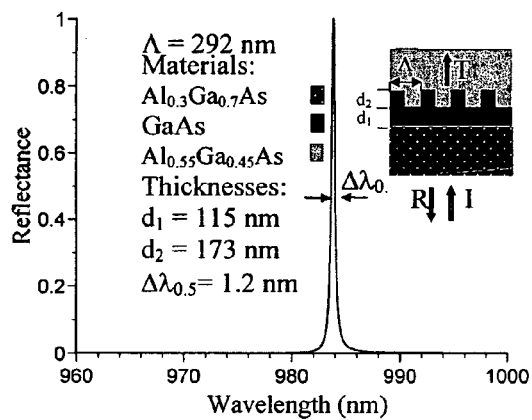
FIG. 27 is a graphical representation of an exemplary spectral reflectance of a two-layer GMR mirror (i.e., a GaAs waveguide and periodic layer embedded in AlGaAs where R=reflectance; T=transmittance; I=incident wave).
Figure 28:
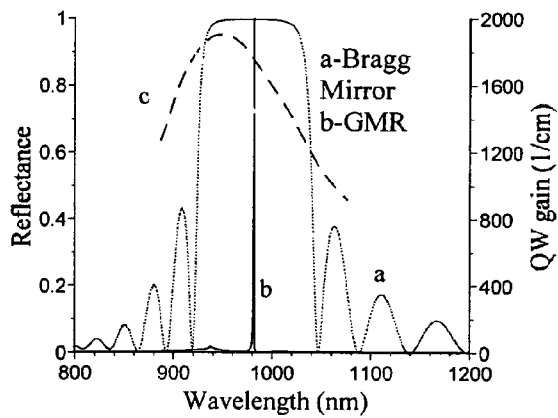
FIG. 28 is a graphical representation of an exemplary spectral response of a distributed Bragg deflector (DBR) mirror (42 layers), a GMR mirror (2 layers), and the gain in a guided mode resonance vertical-cavity surface-emitting laser (VCSEL).

For VCSEL applications, the sufficiently high efficiency, controllable linewidth, and high degree of polarization are key GMR-mirror features. By way of illustration, FIG. 27 shows a calculated spectral response for an exemplary GMR mirror with typical device parameter values for the GaAlAs system indicating layer thicknesses, period Λ, and linewidth Δλ. In this case, the mirror reflects TE-polarized (electric field normal to the page) light at λ=984 nm. FIG. 28 shows the spectral response of a representative device consisting of a DBR mirror, a GMR mirror, and a quantum well (QW) gain layer. As shown, the mirror spectra must overlap the gain curve of the active medium. Additionally, the GMR resonance line must overlap an allowed longitudinal laser cavity mode.

Figure 29A:
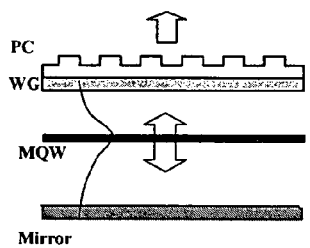
FIGS. 29(a) and 29(b) are schematic illustrations of exemplary VCSELs where an output coupler has been replaced by a resonant mirror.
Figure 29B:
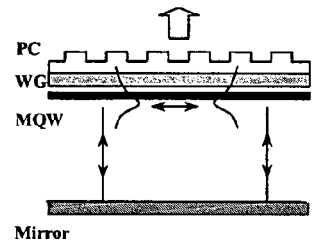

Referring to FIGS. 29(a) and 29(b), which schematically illustrate exemplary VCSELs where an output coupler has been replaced by a resonant mirror [See R. Magnusson, P. P. Young, and D. Shin, "*Vertical cavity laser and laser array incorporating guided-mode resonance effects and methods for making the same*," and U.S. Pat. No. 6,154,480]. FIG. 29(a) shows a true vertical-cavity laser since the oscillation occurs between the GMR mirror and the bottom mirror orthogonal to the multiple-quantum-well (MQW) gain layer that is often stationed at the peak of the standing longitudinal laser mode as indicated. The VCSEL, as shown, would generally require a high cavity Q factor ($Q=\lambda/\Delta\lambda$) as in ordinary VCSELs and the resonant mirror might preferably need to provide 99% reflectivity, which can be a stringent requirement.

FIG. 29(a) schematically illustrates a VCSEL with a DBR mirror replaced by a resonant photonic-crystal (PC) mirror consisting of a periodic element and a waveguide layer (WG). The active layer MQW, as shown, is offset from the waveguide. Also as shown, the peak of the standing, vertically oscillating, laser mode is near the MQW layer. FIG. 29(b) illustrates an alternative structure which may be more desirable as the resonant leaky mode, responsible for the resonant reflection, is near the MQW gain layer. The leaky mode propagates along the gain layer as it radiates downwards and the gain path thus has both lateral and vertical components. Such a high-gain configuration allows mirror reflectivity to fall since the mirror transmission losses are efficiently compensated by the gain. The VCSEL of FIG. 29(b) is substantially similar to the VCSEL of FIG. 29(a) except the active layer is placed near the resonant element to thereby provide elongated gain path via lateral interaction with the leaky mode. The arrows denote the effective gain path and the electric-field profiles of the two counter-propagating leaky modes are also shown. [See R. Magnusson, P. P. Young, and D. Shin, "*Vertical cavity laser and laser array incorporating guided-mode resonance effects and methods for making the same*," and U.S. Pat. No. 6,154,480]. The actual gain realized depends on the overlap integral of the mode profile and the active layer and, therefore, their relative position. The top GMR mirror governs the VCSEL linewidth.

In accordance with the present disclosure, the bottom mirror in FIG. 29 can be replaced by broadband symmetric or asymmetric reflection elements presented above. These elements can be integrated into a monolithic VCSEL chip by proper design and fabrication processes. Alternatively, hybrid attachment of a nonepitaxial broadband mirror is envisioned.

Figure 30:
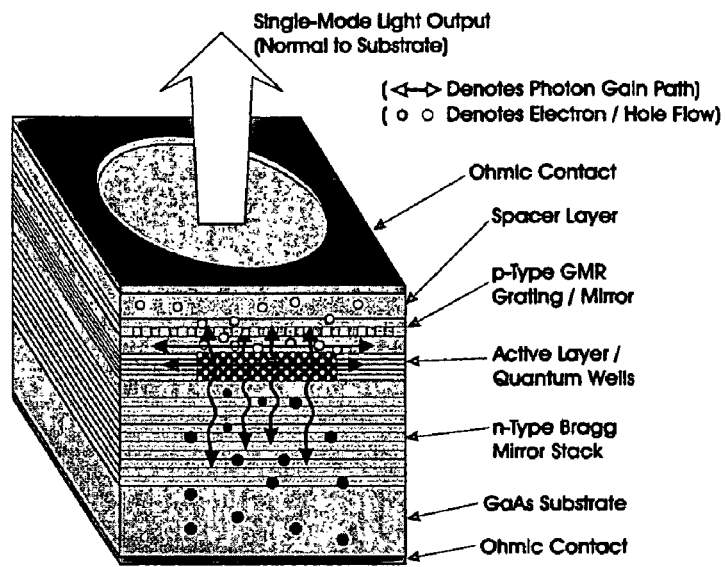
FIG. 30 is an exemplary hybrid electrically excited resonant VCSEL concept employing a resonant periodic layer and a lower DBR mirror in accordance with an illustrative aspect of the present disclosure.
Figure 31:
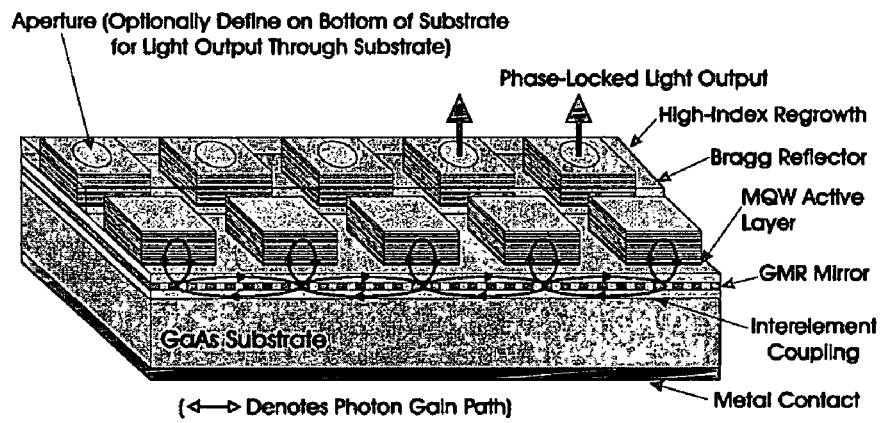
FIG. 31 is an exemplary electrically excited resonant VCSEL array in accordance with an illustrative aspect of the present disclosure.

Having discussed various aspects and features associated with VCSELs in accordance with the present disclosure, it will be readily apparent to those of ordinary skill in the pertinent art that other configurations and/or arrangements suitable to provide the same or similar results equally may be employed and should be considered to fall within the scope of the present disclosure. For instance, as shown in FIGS. 30 and 31, hybrid, electrically pumped lasers and laser arrays that could potentially be realized using resonant periodic elements as discussed herein may be implemented.

Figure 32:
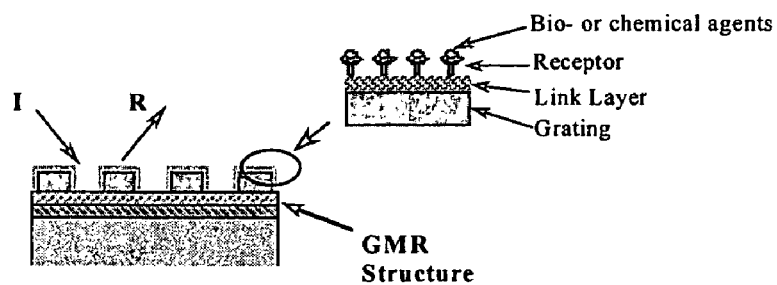
FIG. 32 is an exemplary generic resonant sensor with an agent-receptor that may be pertinent to thickness or refractive index sensing applications.

Referring now to FIG. 32, in still another illustrative embodiment of the present disclosure, a new class of highly sensitive biosensors and/or chemical sensors may be provided that have application in a variety of fields/industries, e.g., medical diagnostics, drug development, environmental monitoring, and/or homeland security.

Figure 33A:
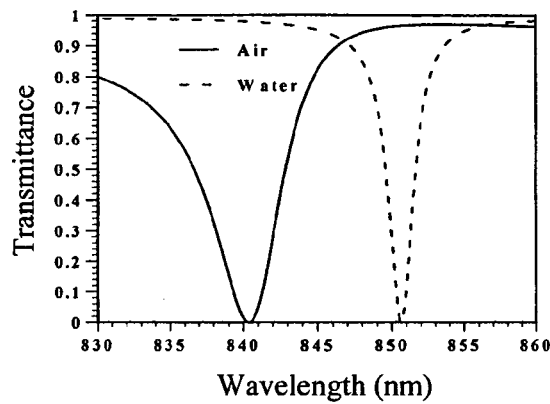
FIGS. 33(a) and 33(b) are graphical representations demonstrating both a calculated spectral shift for a 2-layer sensor and an experimental spectrum taken with Ti:sapphire laser, TE polarized at normal incidence.
Figure 33B:
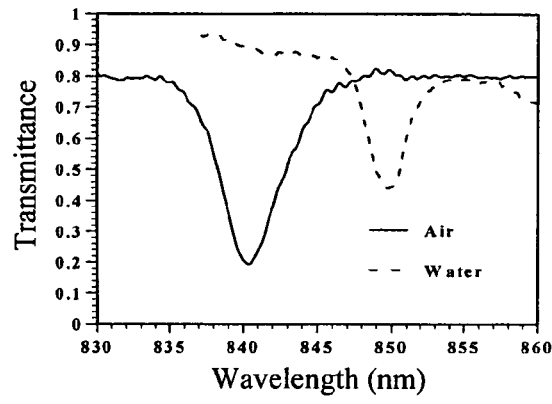
Figure 34A:
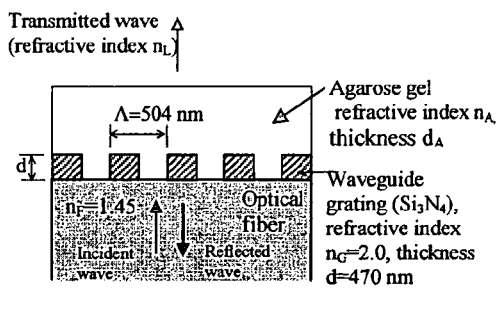
FIGS. 34(a) and 34(b) are schematic and graphical representations of an exemplary resonant fiber-tip waveguide grating with agarose gel for humidity sensing, the calculated resonance peaks and spectral shifts for selected values of percent relative humidity being shown.
Figure 34B:
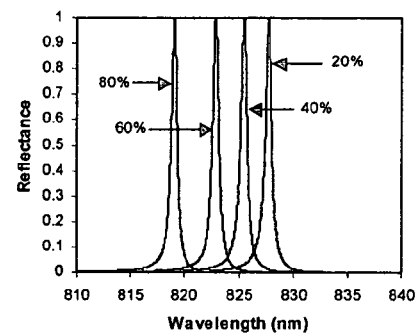

By changing the thickness of a resonant waveguide grating, its resonance frequency may be changed or tuned [See, R. Magnusson and S. S. Wang, "*Optical guided-mode resonance filter*," U.S. Pat. No. 5,216,680, Jun. 1, 1993]. As the parametric coupling range is typically small, these resonating elements tend to exhibit high parametric sensitivity rendering them extremely responsive to small amounts of trace chemicals and/or biological molecules. Biosensor applications are thus feasible as the buildup of the attaching biolayer may be monitored in real time, without use of chemical fluorescent tags, by following the corresponding resonance wavelength shift with a spectrometer [See, D. Wawro, S. Tibuleac, R. Magnusson and H. Liu, "*Optical fiber endface biosensor based on resonances in dielectric waveguide gratings*," Biomedical Diagnostic, Guidance, and Surgical-Assist Systems II, Proc. SPIE, 3911, 86-94 (2000); B. Cunningham, P. Li, B. Lin, and J. Pepper, "*Colorimetric resonant reflection as a direct biochemical assay technique*," Sens. Actuators B 81, 316-328 (2002); B. Cunningham, B. Lin, J. Qiu, P. Li, J. Pepper, and B. Hugh, "*A plastic calorimetric resonant optical biosensor for multiparallel detection of label-free biochemical interactions*," Sens. Actuators B 85, 219-226 (2002)]. Thus, the association rate between the analyte and its designated receptor can be quantified and the characteristics of the entire binding cycle, involving association, disassociation, and regeneration can be registered [See, M. Cooper, *Nature Reviews. Drug Discovery*, 1, 515-528 (2002)]. Similarly, small variations in the refractive indices of the surrounding media can be measured. As demonstrated by FIGS. 33(*a*) and 33(*b*), the effect of changing the sensor environment on the resonance wavelength by, for example, immersion in water can be theoretically and experimentally shown. As illustrated, the measured and computed resonance lineshapes agree qualitatively with good conformity found in the resonance wavelength. As can further be seen, the transmission notch shifts approximately 10 nm for a cover refractive index change from $n_C=1.0$ to $n_C=1.33$. It is noted that decreased efficiency in the water is due to bubble formation on the chamber walls. FIGS. 34(*a*) and 34(*b*) illustrate a relative humidity sensor designed with an optical fiber and agarose gel pickup layer with the computed sensitivity of approximately 6% RH per nm of resonance line shift.

Figure 35:
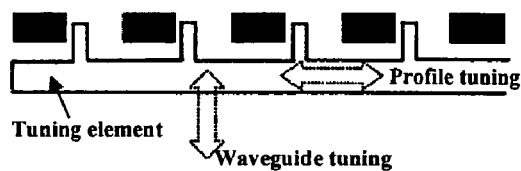
FIGS. 35(a) to 35(c) illustrate mechanically tunable resonant elements in accordance with the present disclosure where the arrows indicate the direction of motion.
Figure 35:
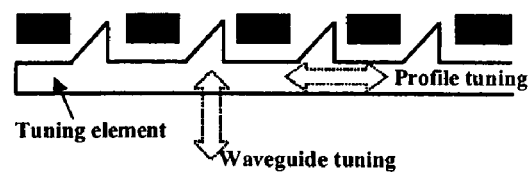
Figure 35:
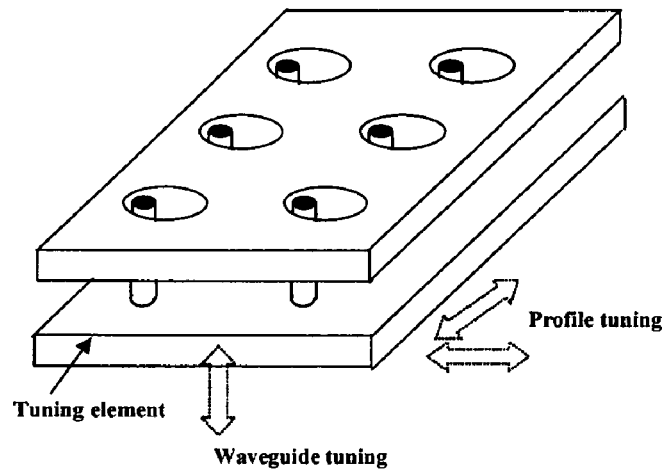

Referring to FIGS. 35(*a*) to 35(*c*), examples of mechanically tunable resonant elements in accordance with the present disclosure are illustrated. FIG. 35(*a*) shows a 1D tunable structure whose tuning element has a binary modulation profile and where the vertical arrow indicates motion to primarily realize fill-factor control, whereas the lateral arrow signifies an ability to primarily control profile symmetry. In FIG. 35(*b*), the inserted grating ridge has a sawtooth or triangular profile. FIG. 35(*c*) indicates a 2D tunable structure whose basic tuning element is a cylindrical post. These systems can be fabricated, for example, using silicon-based MEMS (micro electromechanical systems) technology.

With reference again to FIGS. 13(*a*) and 13(*b*), a GMR biosensor operating in transmission mode is demonstrated. The narrow resonance line will shift within the broad reflection band in response to added biolayers or refractive index changes in the layers or surrounding media.

Thus, the present disclosure discloses and enables a new field of optical devices based on resonant leaky modes in thin periodically modulated films, wherein the shape of the spatial modulation is designed to connect the evanescent diffraction orders to the pertinent leaky modes by proper distribution of the materials within the grating period. Adjacent, distinct resonance frequencies or wavelengths are advantageously produced and convenient shaping of the resulting reflection and transmission spectra for such optical devices may advantageously be accomplished as has been illustrated by numerous examples in this disclosure. The wavelength resonance locations and resonance linewidths may be precisely controlled according to the present disclosure so as to affect the extent to which the leaky modes interact with each other. The interaction spectral range can therefore be large, facilitating production of wideband shaped spectra. The optical spectral properties of a single modulated layer produced according to the present disclosure advantageously rival and exceed the performance provided by much more elaborate (i.e., multilayer) conventional thin-film devices.

Exemplary methods of the present disclosure facilitate manufacture/production of optical devices wherein multiple evanescent diffraction orders are provided in a single layer that may have a symmetric or asymmetric profile. Multiple first and higher evanescent diffraction orders may advantageously interact with the fundamental and higher waveguide modes to yield unique optical spectral characteristics.

As described herein, a single modulated wave-guiding layer, i.e., a type of a waveguide grating, with one-dimensional (1D) periodicity deposited on a substrate having arbitrary properties and having a top cover with arbitrary properties, is provided with an effective refractive index that is higher than those of the surrounding media. An asymmetric device according to the present disclosure may be modulated in two dimensions (2D). In this aspect, a 2D pattern can be a regular lattice of dots, or mesas, or holes with an appropriately offset sub-lattice to create the asymmetry. Alternatively, the 2D pattern can consist of arbitrarily shaped holes or mesas yielding the asymmetry. In yet another aspect of the present disclosure, the 2D pattern can be symmetric or asymmetric and, as in the 1D case, the material distribution within each period may be chosen to represent any arbitrary pattern. The present disclosure further provides a system of two or more layers that may be employed to enhance the leaky-mode device performance as well as to provide new resonant layered systems with added flexibility and exhibiting new and/or advantageous physical functions and functionalities.

The advantages and features associated with the aspects identified and discussed in the present disclosure are utilized in designing various optical devices including, for example, narrowband reflecting structures and filters (bandstop filters), wideband reflecting structures and filters (bandstop filters, mirrors), narrowband transmitting structures and filters (bandpass filters), and wideband transmitting structures and filters (bandpass filters). In addition, such advantages and features are effectively employed when using 1D periodicity to implement polarization independent devices such as narrowband and wideband bandstop and bandpass filters, or using 1D periodicity to implement polarization independent reflectors where the phase between the two orthogonal components is 180 degrees to implement a half-wave polarization plate or is 90 degrees to realize a quarter-wave plate. That is, as the amplitude for each polarization component has nearly unity reflectance and the phase is controllable by design, a variety of devices can be implemented for polarization control.

Having described certain aspects associated with resonance sensors and the like, such resonance elements, in accordance with an exemplary aspect of the present disclosure, may utilize leaky modes that are, for example, localized waves propagating along the surface so as to result in a resonance highly sensitive to the conditions of the surface and the layers along which the modes glide. Further, beneficial applications of the systems and methods disclosed herein are envisioned in other spectral regions including, for example, the microwave region and the millimeter-wave region.

Although the numerous resonant leaky-mode optical devices realized with thin periodically modulated films wherein the spatial modulation has a structural profile suitable for resonant leaky mode excitation with selected evanescent diffraction orders, as discussed in the present disclosure, have been demonstrated with reference to exemplary embodiments thereof, the present disclosure is not limited to such exemplary embodiments and/or preferred aspects. Rather, the present disclosure extends to and encompasses such modifications, variations and/or enhancements that will be apparent to persons skilled in the pertinent art in view of the detailed description provided herein.

The publications previously identified, as well as those listed below, are incorporated herein by reference to the extent that they explain, supplement, provide background for or teach methodology, techniques and/or compositions employed herein. Of note, some of the noted publications are not prior art to the subject matter of the present application under applicable rules and regulations.

R. Magnusson, Y. Ding, K. J. Lee, D. Shin, P. S. Priambodo, P. P. Young, and T. A. Maldonado, "*Photonic devices enabled by waveguide-mode resonance effects in periodically modulated films*," Proc. SPIE, Vol. 5225 Nano- and Micro-Optics for Information Systems, edited by Louay A. Eldada, (SPIE, Bellingham, Wash., 2003) pp. 20-34.

Y. Ding and R. Magnusson, "*Polarization independent resonant bandstop filters using 1D periodic layers with asymmetric profiles*," Diffractive Optics and Micro-Optics Topical Meeting, DOMO 2004, Rochester, N.Y., Oct. 10-14, 2004.

R. Magnusson and D. Shin, "*Diffractive Optical Components*," Encyclopedia of Physical Science and Technology, Third Edition, Vol. 4, pp. 421-440 Academic Press, 2002.

Y. Ding and R. Magnusson, "*Doubly-resonant single-layer bandpass optical filters*," Optics Letters, vol. 29, pp. 1135-1137, May 2004.

Y. Ding and R. Magnusson, "*Use of nondegenerate resonant leaky modes to fashion diverse optical spectra*," Optics Express, vol. 12, pp. 1885-1891, May 3, 2004. [http://www.opticsexpress.org/abstract.cfm?URI=OPEX-12-9-1885]

Y. Ding and R. Magnusson, "*Resonant leaky-mode spectral-band engineering and device applications*," Opt. Express 12, 5661-5674 (2004). [http://www.opticsexpress.org/abstract.cfm?URI=OPEX-12-23-5661]

R. Magnusson and Y. Ding, "*Spectral-band engineering with interacting resonant leaky modes in thin periodic films*," Proc. SPIE, vol. 5720, Conference on Micromachining Technology for Microoptics and Nanooptics, edited by E. G. Johnson, (SPIE, Bellingham, Wash., 2005), pp. 119-129 (invited).

D. L. Brundrett, E. N. Glytsis, T. K. Gaylord, and J. M. Bendickson, "*Effects of modulation strength in guided-mode resonant subwavelength gratings at normal incidence*," J. Opt. Soc. Am. A. 17, 1221-1230 (2000).

P. Vincent and M. Neviere, "*Corrugated dielectric waveguides: A numerical study of the second-order stop bands*," Appl. Phys. 20, 345-351 (1979).

L. Mashev and E. Popov, "*Zero order anomaly of dielectric coated gratings*," Opt. Commun. 55, 377-380 (1985).

S. Peng and G. M. Morris, "*Experimental demonstration of resonant anomalies in diffraction from two-dimensional gratings*," Opt. Lett. 21, 549-551 (1996).

D. Rosenblatt, A. Sharon, and A. A. Friesem, "Resonant grating waveguide structure," IEEE J. Quant. Electronics 33, 2038-

M. T. Gale, K. Knop, and R. H. Morf, "*Zero-order diffractive microstructures for security applications*," Proc. SPIE on Optical Security and Anticounterfeiting Systems 1210, 83-89 (1990).

C. F. R. Mateus, M. C. Y. Huang, L. Chen, C. J. Chang-Hasnain, and Y. Suzuki, "*Broad-band mirror (1.12-1.62 µm) using a subwavelength Grating*," IEEE Photonics Tech. Lett. 16, 1676-1678 (2004).

W. Suh and S. Fan, "*All-pass transmission or flattop reflection filters using a single photonic crystal slab*," Appl. Phys. Lett. 84, 4905-4907 (2004).

R. F. Kazarinov and C. H. Henry, "*Second-order distributed-feedback lasers with mode selection provided by first-order radiation loss*," IEEE J. Quant. Elect. QE-21, 144-150 (1985).

The invention claimed is:

1. An optical resonant leaky-mode device comprising:
at least one substrate layer;
at least one spatially modulated, periodic waveguiding layer deposited over said substrate layer; and
at least one cover layer over said spatially modulated waveguiding layer,
wherein the period of said modulated waveguiding layer has an asymmetric structural profile, and
wherein parameters associated with the optical resonant leaky-mode device are defined to admit resonant leaky modes.

2. The optical resonant leaky-mode device of claim 1, wherein said spatially modulated waveguiding layer has one-dimensional periodicity.

3. The optical resonant leaky-mode device of claim 1, wherein said spatially modulated waveguiding layer has two-dimensional periodicity.

4. The optical resonant leaky-mode device of claim 3, wherein said two-dimensional periodicity is provided by any of a lattice dot pattern, a mesas pattern, or a hole pattern with an offset sublattice to create asymmetry, or any combination thereof.

5. The optical resonant leaky-mode device of claim 1, wherein the refractive index of said spatially modulated waveguiding layer is higher than the refractive indices of said substrate and said cover layer.

6. The optical resonant leaky-mode device of claim 1, wherein two or more spatially modulated waveguiding layers are deposited on said substrate.

7. The optical resonant leaky-mode device of claim 1, wherein said device is selected from the group consisting of a narrowband reflecting structure, a narrowband reflecting filter, a wideband reflecting structure, a wideband reflecting filter, a narrowband transmitting structure, a narrowband transmitting filter, a wideband transmitting structure, and a wideband transmitting filter.

8. The optical resonant leaky-mode device of claim 1, wherein said spatially modulated waveguiding layer has one-dimensional periodicity that is effective to impart polarization independence.

9. The optical resonant leaky-mode device of claim 1, wherein said spatially modulated waveguiding layer has one-dimensional periodicity, where the phase between two orthogonal components is 180 degrees so as to affect half-wave polarization plate.

10. The optical resonant leaky-mode device of claim 1, wherein said spatially modulated waveguiding layer has one-dimensional periodicity, where the phase between two orthogonal components is 90 degrees so as to affect quarter-wave plate.

11. An optical resonant leaky-mode device comprising:
a substrate, and
at least one thin, periodically modulated waveguiding layer deposited on said substrate, said waveguiding layer possessing asymmetric grating profile for breaking the resonant leaky mode degeneracy at normal incidence,
wherein parameters associated with the optical resonant leaky-mode device are defined to admit one or more resonant leaky modes and to provide precise spectral spacing of interacting leaking modes.

12. The optical resonant leaky-mode device of claim 11, wherein said waveguiding layer has one-dimensional periodicity.

13. The optical resonant leaky-mode device of claim 11, wherein said waveguiding layer has two-dimensional periodicity.

14. The optical resonant leaky-mode device of claim 13, wherein said two-dimensional periodicity is provided by any of a lattice dot pattern, a mesas pattern, or a hole pattern with an offset sublattice to create asymmetry, or a combination thereof.

15. The optical resonant leaky-mode device of claim 11, wherein the refractive index of said waveguiding layer is higher than the refractive indices of said substrate and said cover.

16. The optical resonant leaky-mode device of claim 11, wherein two or more waveguiding layers are deposited on said substrate.

17. The optical resonant leaky-mode device of claim 11, wherein said device is selected from the group consisting of a narrowband reflecting structure, a narrowband reflecting filter, a wideband reflecting structure, a wideband reflecting filter, a narrowband transmitting structure, a narrowband transmitting filter, a wideband transmitting structure, and a wideband transmitting filter.

18. An optical resonant leaky-mode structure comprising:
at least one substrate layer;
at least one periodic, spatially modulated waveguiding layer deposited over said substrate layer; and
at least one cover layer over said modulated waveguiding layer to define a resonant leaky-mode assembly,
wherein parameters associated with the structure are defined to admit resonant leaky modes and wherein the period of said at least one periodic, spatially modulated waveguiding layer is defined by one or more materials distributed so as to define a profile that is selected from the group consisting of a symmetric profile, an asymmetric profile and combinations thereof.

19. The optical resonant leaky-mode structure of claim 18, wherein each profile is binary with one or more materials placed within each period.

20. The optical resonant leaky-mode structure of claim 18, wherein two or more materials are used to configure said profile.

21. The optical resonant leaky-mode structure of claim 18, wherein said profile has a saw-tooth shape.

22. The optical resonant leaky-mode structure of claim 18, wherein said structure is selected from the group consisting of an integrated/hybrid broadband VCSEL mirror, a transmission biosensor, a narrowband reflecting structure, a narrowband reflecting filter, a wideband reflector, a wideband reflecting filter, a narrowband transmitting structure, a narrowband transmitting filter, a wideband transmitting structure, and a wideband transmitting filter.

23. The optical resonant leaky-mode structure of claim 18, wherein said structure functions as a wideband reflector having a symmetric Type II profile.

24. The optical resonant leaky-mode structure of claim 18, wherein said structure is a polarizer with an asymmetric Type II profile.

25. The optical resonant leaky-mode structure of claim 18, wherein said structure is a polarizer with a symmetric Type II profile.

26. The optical resonant leaky-mode structure of claim 18, wherein said structure is an antireflection element with an asymmetric Type II profile.

27. The optical resonant leaky-mode structure of claim 18, wherein said structure is an antireflection element with a symmetric Type II profile.

28. The optical resonant leaky-mode structure of claim 18, wherein said material within each period is anisotropic, thereby providing TE-TM mode conversion within said waveguiding layer and permitting interaction between dissimilar modes.

29. The optical resonant leaky-mode structure of claim 18, wherein said at least one modulated waveguiding layer includes a periodic grating layer and a separate homogenous waveguide layer adjacent to said periodic grating layer.

30. The optical resonant leaky-mode structure of claim 18, wherein said at least one modulated waveguiding layer includes a combination of homogeneous layers and periodic grating layers.

31. The optical resonant leaky-mode structure of claim 18, wherein the at least one modulated waveguiding layer is characterized by a fill factor, and wherein said at least one modulated waveguiding layer is adapted to permit dynamic variation of said fill factor.

32. The optical resonant leaky-mode structure of claim 31, wherein said fill factor is dynamically varied in connection with at least one of the following: (i) spectral tuning and (ii) spectral shaping.

33. The optical resonant leaky-mode structure of claim 31, wherein the fill factor is varied by insertion of a grating ridge into a grating groove.

34. The optical resonant leaky-mode structure of claim 33, wherein the grating ridge is inserted by at least one of mechanical or a micro-electromechanical technique.

35. The optical resonant leaky-mode structure of claim 33, wherein the grating ridge and the grating groove have substantially rectangular shapes.

* * * * *